United States Patent
Jang et al.

(10) Patent No.: US 12,349,334 B2
(45) Date of Patent: Jul. 1, 2025

(54) SEMICONDUCTOR STRUCTURE AND METHOD FOR MANUFACTURING SAME

(71) Applicant: CHANGXIN MEMORY TECHNOLOGIES, INC., Hefei (CN)

(72) Inventors: Semyeong Jang, Hefei (CN); Joonsuk Moon, Hefei (CN); Deyuan Xiao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 422 days.

(21) Appl. No.: 17/934,558

(22) Filed: Sep. 22, 2022

(65) Prior Publication Data

US 2023/0019926 A1    Jan. 19, 2023

Related U.S. Application Data

(63) Continuation of application No. PCT/CN2022/101503, filed on Jun. 27, 2022.

(30) Foreign Application Priority Data

Jun. 8, 2022    (CN) .......................... 202210644418.0

(51) Int. Cl.
H10B 12/00            (2023.01)
(52) U.S. Cl.
CPC ........... *H10B 12/05* (2023.02); *H10B 12/315* (2023.02)
(58) Field of Classification Search
None
See application file for complete search history.

(56) References Cited

U.S. PATENT DOCUMENTS

| | | | |
|---|---|---|---|
| 5,244,824 A | 9/1993 | Sivan | |
| 6,376,303 B1 | 4/2002 | Seo | |
| 9,349,746 B1 * | 5/2016 | Yang | ................ H01L 21/76877 |
| 9,673,257 B1 | 6/2017 | Takaki | |
| 2006/0043471 A1 | 3/2006 | Tang | |
| 2006/0046391 A1 | 3/2006 | Tang | |
| 2007/0020819 A1 | 1/2007 | Tang | |
| 2007/0048943 A1 | 3/2007 | Tang | |

(Continued)

FOREIGN PATENT DOCUMENTS

| | | |
|---|---|---|
| CN | 101017825 A | 8/2007 |
| CN | 101740500 A | 6/2010 |

(Continued)

*Primary Examiner* — Steven M Page
(74) *Attorney, Agent, or Firm* — Syncoda LLC; Feng Ma

(57) ABSTRACT

A semiconductor structure includes a substrate, a gate structure, a cover layer and a first sacrificial structure. The substrate includes discrete semiconductor channels arranged at a top of the substrate. The gate structure is disposed in a middle region of a semiconductor channel, and includes a ring structure and a bridge structure. The ring structure encircles the semiconductor channel, and the bridge structure penetrates through the semiconductor channel and extends to an inner wall of the ring structure along a penetrating direction. The cover layer is located between adjacent semiconductor channels, and includes a first communication hole. The first sacrificial structure is located on the cover layer, and includes a second communication hole. An inner sidewall of the second communication hole has an irregular shape.

15 Claims, 25 Drawing Sheets

(56) References Cited

U.S. PATENT DOCUMENTS

| | | |
|---|---|---|
| 2007/0181925 A1* | 8/2007 | Yoon .................... H10D 30/635 257/296 |
| 2007/0224753 A1 | 9/2007 | Tang |
| 2009/0072291 A1 | 3/2009 | Takaishi |
| 2009/0207649 A1 | 8/2009 | Tang |
| 2010/0120221 A1 | 5/2010 | Kang |
| 2010/0213525 A1 | 8/2010 | Masuoka |
| 2011/0104862 A1 | 5/2011 | Kadoya |
| 2011/0171796 A1 | 7/2011 | Tang |
| 2013/0011987 A1 | 1/2013 | Park |
| 2013/0056698 A1 | 3/2013 | Satoh |
| 2013/0075813 A1 | 3/2013 | Kadoya |
| 2015/0017767 A1 | 1/2015 | Masuoka et al. |
| 2015/0380548 A1 | 12/2015 | Wang et al. |
| 2016/0204251 A1 | 7/2016 | Masuoka et al. |
| 2017/0271510 A1 | 9/2017 | Wang et al. |
| 2017/0309632 A1 | 10/2017 | Masuoka et al. |
| 2017/0323977 A1 | 11/2017 | Cheng et al. |
| 2018/0083136 A1 | 3/2018 | Xie et al. |
| 2018/0096896 A1 | 4/2018 | Zhu |
| 2018/0175212 A1 | 6/2018 | Cheng et al. |
| 2019/0027570 A1 | 1/2019 | Ching et al. |
| 2019/0115438 A1 | 4/2019 | Ching et al. |
| 2019/0123053 A1 | 4/2019 | Masuoka et al. |
| 2019/0237581 A1 | 8/2019 | Saito et al. |
| 2019/0326395 A1 | 10/2019 | Ando et al. |
| 2020/0020812 A1 | 1/2020 | Masuoka et al. |
| 2020/0052084 A1 | 2/2020 | Ching et al. |
| 2020/0343260 A1* | 10/2020 | Wang .................... H10D 64/037 |
| 2021/0305431 A1 | 9/2021 | Ishimaru et al. |
| 2022/0069070 A1 | 3/2022 | Lai et al. |
| 2022/0102347 A1 | 3/2022 | Lai et al. |
| 2022/0139918 A1 | 5/2022 | Lee |
| 2022/0139920 A1 | 5/2022 | Lee |
| 2022/0199837 A1 | 6/2022 | Masuoka et al. |
| 2022/0262954 A1 | 8/2022 | Ishimaru et al. |

FOREIGN PATENT DOCUMENTS

| | | |
|---|---|---|
| CN | 101933135 A | 12/2010 |
| CN | 102867752 A | 1/2013 |
| CN | 105280698 A | 1/2016 |
| CN | 106252352 A | 12/2016 |
| CN | 107845578 A | 3/2018 |
| CN | 110476230 A | 11/2019 |
| CN | 110931429 A | 3/2020 |
| CN | 113078155 A | 7/2021 |
| CN | 113078156 A | 7/2021 |
| CN | 113451405 A | 9/2021 |
| CN | 114464535 A | 5/2022 |
| CN | 114497039 A | 5/2022 |
| EP | 1804286 A1 | 7/2007 |
| WO | 2013033267 A1 | 3/2013 |

* cited by examiner

SEMICONDUCTOR STRUCTURE AND METHOD FOR MANUFACTURING SAME

CROSS-REFERENCE TO RELATED APPLICATIONS

This is a U.S. continuation application of International Application No. PCT/CN2022/101503 filed on Jun. 27, 2022, which claims priority to Chinese Patent Application No. 202210644418.0 filed on Jun. 8, 2022. The disclosures of the above-referenced applications are hereby incorporated by reference in their entirety.

BACKGROUND

As an integration density of a dynamic memory develops higher and higher, it is necessary to improve an electrical property of a small-sized functional device, while an arrangement of transistors in a dynamic memory array structure and how to reduce a size of a single functional device in the dynamic memory array structure are studied.

When using a vertical gate all around (VGAA) transistor structure as an access transistor of the dynamic memory, higher density efficiency can be achieved. However, in some implementations, a capacitance of a capacitor connected to the access transistor is low, which affects an overall electrical property of a semiconductor structure.

SUMMARY

In view of this, embodiments of the disclosure provide a semiconductor structure and a method for manufacturing the same, which can improve the overall electrical property of the semiconductor structure.

The technical solutions of embodiments of the disclosure are realized as follows.

Embodiments of the disclosure provide a semiconductor structure including a substrate, a gate structure, a cover layer and a first sacrificial structure.

The substrate includes discrete semiconductor channels arranged at a top of the substrate and extending along a vertical direction.

The gate structure is disposed in a middle region of a semiconductor channel and includes a ring structure and a bridge structure. The ring structure encircles the semiconductor channel, and the bridge structure penetrates through the semiconductor channel and extends to an inner wall of the ring structure along a penetrating direction.

The cover layer is located in a spacer region between adjacent semiconductor channels, and includes a first communication hole extending along the vertical direction.

The first sacrificial structure is located on the cover layer, and includes a second communication hole extending along the vertical direction. The second communication hole is in communication with a top of the semiconductor channel via the first communication hole, and an inner sidewall of the second communication hole has an irregular shape.

Embodiments of the disclosure further provide a method for manufacturing a semiconductor structure including the following operations. A substrate including discrete semiconductor channels is provided, in which the semiconductor channels are disposed at a top of the substrate and extend along a vertical direction. A gate structure is formed in a middle region of a semiconductor channel, in which the gate structure includes a ring structure and a bridge structure, the ring structure encircles the semiconductor channel, and the bridge structure penetrates through the semiconductor channel and extends to an inner wall of the ring structure along a penetrating direction. A cover layer is formed in a spacer region between adjacent semiconductor channels, in which the cover layer includes a first communication hole extending along the vertical direction. A first sacrificial structure is formed on the cover layer, in which the first sacrificial structure includes a second communication hole extending along the vertical direction. The second communication hole is in communication with a top of the semiconductor channel via the first communication hole, and an inner sidewall of the second communication hole has an irregular shape.

DETAILED DESCRIPTION

In order to make the purposes, technical solutions and advantages of the present disclosure clearer, the technical solutions of the present disclosure are further described in detail below in combination with the accompanying drawings and the embodiments. The described embodiments should not be regarded as limitations to the present disclosure. All other embodiments obtained by those of ordinary skill in the art without creative work shall fall within the scope of protection of the present disclosure.

In the following description, reference is made to "some embodiments" which describe a subset of all possible embodiments. However, it is understood that "some embodiments" may be a same subset or different subsets of all possible embodiments, and may be combined with each other without conflict.

If a description such as "first/second" appears in the application document, the following explanation will be added. In the following description, the involved terms "first/second/third" are only used to distinguish similar objects, and do not represent a specific order of the objects. It is understood that the specific order or sequence of "first/second/third" may be interchangeable if applicable, so that the embodiments of the present disclosure described herein may be implemented in an order other than those shown or described herein.

Unless otherwise defined, all technical and scientific terms used herein have the same meanings as those commonly understood by those skilled in the art of the present disclosure. The terms herein are only used for the purpose of describing the embodiments of the present disclosure and are not intended to limit the present disclosure.

Figure 1:
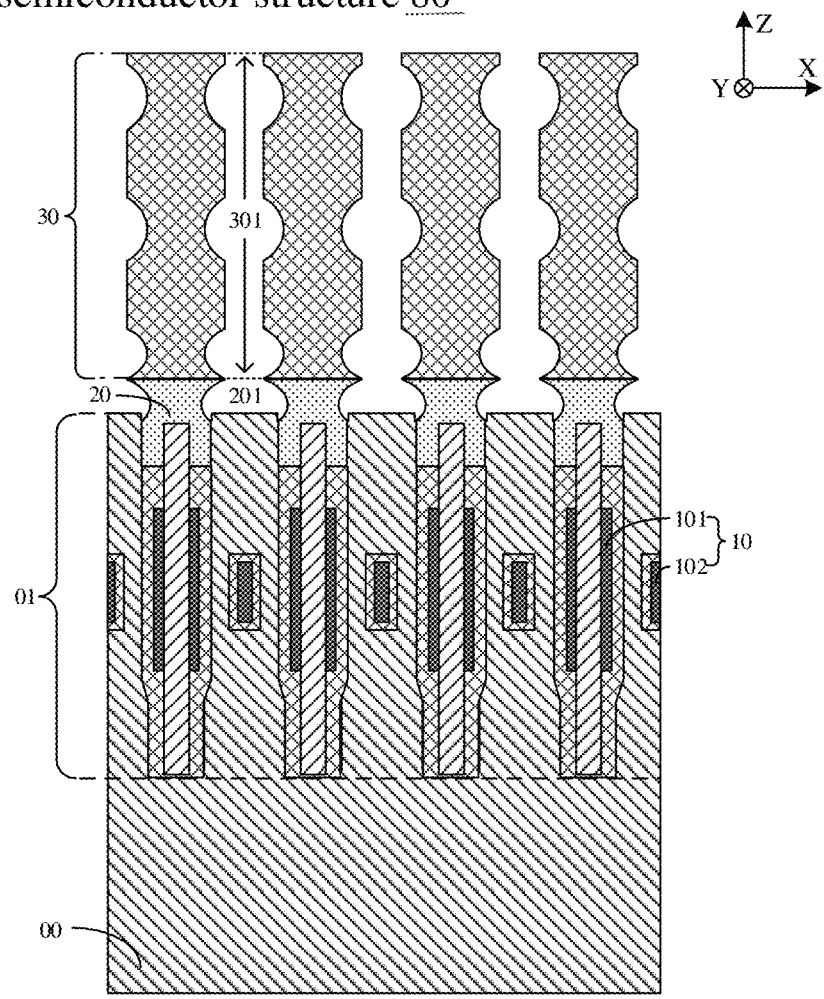
FIG. 1 is a first schematic diagram of a semiconductor structure provided by embodiments of the disclosure.

FIG. 1 is an optional schematic structural diagram of a semiconductor structure provided by embodiments of the disclosure. As shown in FIG. 1, the semiconductor structure 80 includes a substrate 00, a gate structure 10, a cover layer 20 and a first sacrificial structure 30.

Herein, the substrate 00 includes discrete semiconductor channels 01 arranged at a top of the substrate 00 and extending along a vertical direction Z.

The gate structure 10 is disposed in a middle region of a semiconductor channel 01, and includes a ring structure 101 and a bridge structure 102. The ring structure 101 encircles the semiconductor channel 01, and the bridge structure 102 penetrates through the semiconductor channel 01 and extends to an inner wall of the ring structure 101 along a penetrating direction.

The cover layer 20 is located in a spacer region between adjacent semiconductor channels 01, and includes a first communication hole 201 extending along the vertical direction Z.

The first sacrificial structure 30 is located on the cover layer 20, and the first sacrificial structure 30 includes a second communication hole 301 extending along the vertical direction Z. The second communication hole 301 is in communication with a top of the semiconductor channel 01 via the first communication hole 201, and an inner sidewall of the second communication hole 301 has an irregular shape.

The first sacrificial structure 30 further includes an additional doped region 302 and an intrinsic region 303. A doping concentration of the additional doped region 302 is greater than a doping concentration of the intrinsic region 303.

In the embodiments of the disclosure, the substrate 00 may include at least one of semiconductor materials, for example, silicon (Si), germanium (Ge), silicon germanium (SiGe) or other Group IV elements, or gallium arsenide (GaAs), aluminum gallium arsenide (AlGaAs), indium arsenide (InAs), gallium indium arsenide (InGaAs) or other Group III-V compounds. Hereinbelow, an exemplary description is given with the substrate 00 including the silicon element. The semiconductor channel 01 may have a doping element to improve a conductivity of the semiconductor channel 01. The doping element may be a P-type doping element or an N-type doping element. The N-type doping element may be at least one of arsenic (As), phosphorus (P) or antimony (Sb), and the P-type doping element may be at least one of boron (B), indium (In) or gallium (Ga). A material of the gate structure 10 may be titanium nitride (TiN), or at least one of tantalum nitride (TaN), copper (Cu), tungsten (W) or other conducting materials. Hereinbelow, an exemplary description is given with titanium nitride.

Figure 2:
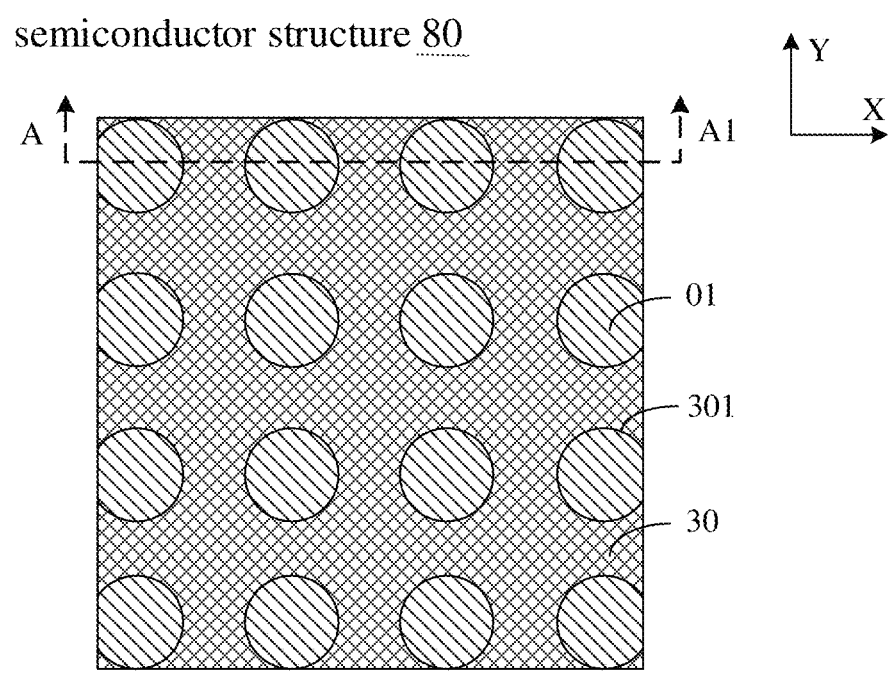
FIG. 2 is a second schematic diagram of a semiconductor structure provided by embodiments of the disclosure.

FIG. 2 shows a pattern of the second communication hole 301 in a top view and FIG. 1 is a cross-sectional view taken along a cross-sectional line A-A1 of FIG. 2. By etching the first sacrificial structure 30 with a mask, the second communication hole 301 as shown in FIG. 1 and FIG. 2 can be obtained. Furthermore, in the subsequent process, a capacitor can be formed in the first communication hole 201 and the second communication hole 301, and an electrode plate of the capacitor covers inner sidewalls of the first communication hole 201 and the second communication hole 301. It should be noted that a first direction X and a second direction Y shown in FIG. 2 are perpendicular to the vertical direction Z shown in FIG. 1. The first direction X and the second direction Y can be perpendicular to each other or at any included angle. Hereinbelow, an exemplary description is given with the first direction X being perpendicular to the second direction Y.

Figure 3:
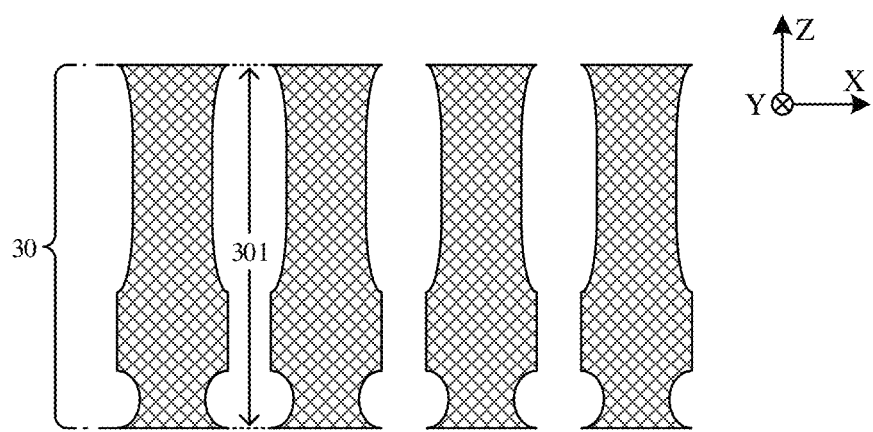
FIG. 3 is a third schematic diagram of a semiconductor structure provided by embodiments of the disclosure.

In the embodiments of the disclosure, the inner sidewall of the second communication hole 301 has the irregular shape, that is to say, a cross-sectional profile of the inner sidewall of the second communication hole 301 is not only composed of straight lines. FIG. 3 shows another optional schematic structural diagram of the cross-sectional profile of the inner sidewall of the second communication hole 301. Referring to FIG. 1 and FIG. 3, compared to a communication hole with an inner sidewall having a regular shape such as a cylinder shape, an area of the inner sidewall of the second communication hole 301 shown in FIG. 1 or FIG. 3 is greater, when lengths of the communication holes along the vertical direction Z are the same.

It can be understood that a capacitor can be formed in the second communication hole 301, and a capacitor plate covers the inner sidewall of the second communication hole 301, so that an area of the capacitor plate can be increased and a capacity of the capacitor can be improved, thereby improving the overall electrical property of the semiconductor structure 80.

In some embodiments of the disclosure, the first sacrificial structure 30 further includes the additional doped region 302 and the intrinsic region 303. The doping concentration of the additional doped region 302 is greater than the doping concentration of the intrinsic region 303. In the first sacrificial structure 30, an aperture of the second communication hole 301 in the additional doped region 302 is greater than the aperture thereof in the intrinsic region 303. In the embodiments of the disclosure, since the doping concentration of the additional doped region 302 is greater than the doping concentration of the intrinsic region 303, the additional doped region 302 can be etched more easily than the intrinsic region 303, and the additional doped region 302 is prone to form an isotropic etched structure.

Figure 4:
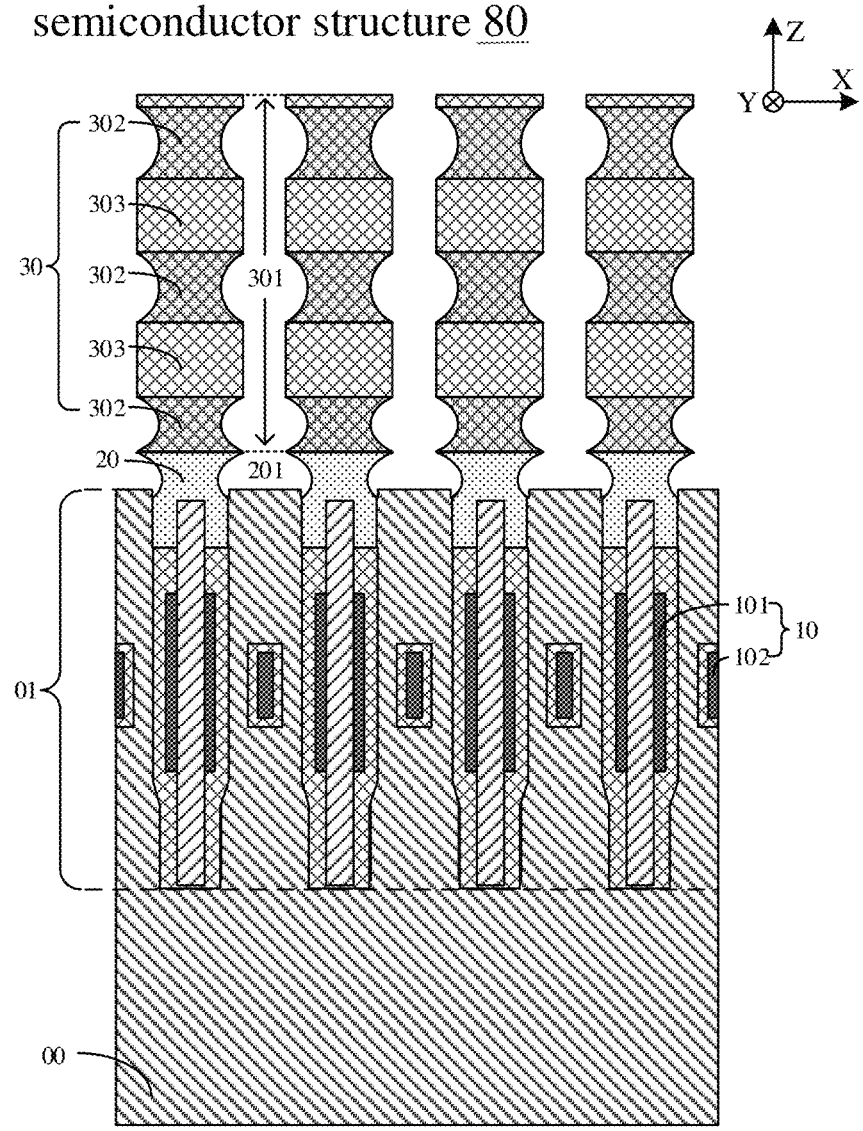
FIG. 4 is a fourth schematic diagram of a semiconductor structure provided by embodiments of the disclosure.

Referring to FIG. 4, for part of the second communication hole 301 located in the additional doped region 302, its cross-sectional profile is an arc, that is, the isotropic etched structure is formed; and for part of the second communication hole 301 located in the intrinsic region 303, its cross-sectional profile is a straight line, that is, an anisotropic etched structure is formed, so that the cross-sectional profile of the inner sidewall of the second communication hole 301 is wavy. That is, the aperture of the second communication hole 301 in the additional doped region 302 is greater than the aperture thereof in the intrinsic region 303.

In some embodiments of the disclosure, referring to FIG. 4, a material of the first sacrificial structure 30 may be a boro-phospho-silicate glass (BPSG), and both the additional doped region 302 and the intrinsic region 303 are doped with boron. A boron content of the additional doped region 302 is greater than a boron content of the intrinsic region 303. In some embodiments, the intrinsic region 303 may be formed from an undoped BPSG, while the additional doped region 302 may be formed from a boron doped BPSG.

In some embodiments of the disclosure, referring to FIG. 4, in the first sacrificial structure 30, additional doped regions 302 and intrinsic regions 303 are alternately arranged along the vertical direction Z. A thickness of an additional doped region along the vertical direction Z is less than a thickness of an intrinsic region along the vertical direction Z.

In the embodiments of the disclosure, the first sacrificial structure 30 may be doped by an ion implantation (IMP) process to form the additional doped regions 302. By controlling the ion implantation process with different energies, regions of different depths in first sacrificial structure 30 can be doped, thereby forming the additional doped regions 302 and intrinsic regions 303 arranged alternately.

It can be understood that, because the additional doped region 302 can be etched more easily than the intrinsic region 303, the inner sidewall of the second communication hole 301 has the irregular shape. As illustrated in FIG. 4, the aperture of the second communication hole 301 in an additional doped region 302 is greater than the aperture thereof in an intrinsic region 303, and the cross-sectional profile of the inner sidewall of the second communication hole 301 is wavy. A capacitor is formed in the second communication hole 301, and its capacitor plate covers the inner sidewall of the second communication hole 301, so that the area of the capacitor plate can be increased and the capacity of the capacitor can be improved.

In some embodiments of the disclosure, referring to FIG. 1, a top of the first communication hole 201 is higher than the top of semiconductor channel 01. The top of the first communication hole 01 and the part of the sidewall near its top are exposed by the first communication hole 201.

In the embodiments of the disclosure, in the subsequent process, the capacitor can be formed in the first communication hole 201 and the second communication hole 301. The first communication hole 201 can expose the top of semiconductor channel 01 and the part of the sidewall near its top, thus increasing a contact area between the semiconductor channel 01 and the capacitor to be formed subsequently, thus reducing the contact resistance and improving the electrical property.

In some embodiments of the disclosure, referring to FIG. 1, in the cover layer 20, a middle aperture of the first communication hole 201 is greater than a top aperture or a bottom aperture thereof. It should be noted that the middle of the first communication hole 201 refers to a region between its top and bottom. Because the electrode plate of the capacitor can be formed in the first communication hole 201, if the aperture of its top or the aperture of its bottom is too large, it is not easy to protect the capacitor, and a risk of short circuit is high. As a result, the top aperture and the bottom aperture of the first communication hole 201 should not be too large. Furthermore, the middle aperture of the first communication hole 201 is enlarged, so that the middle aperture is larger than the top aperture and the bottom aperture. In this way, on the one hand, it will not increase the risk of short circuit; on the other hand, it is beneficial to increase a surface area of the electrode plate and the capacitance.

In some embodiments of the disclosure, referring to FIG. 1, a top of the cover layer 20 is higher than the top of semiconductor channel 01. It can be understood that the top of the cover layer 20 is higher than the top of the semiconductor channel 01, so that capacitor plates formed in first communication holes 201 can be isolated from each other and short circuit can be prevented.

In some embodiments of the disclosure, a material of the cover layer 20 shown in FIG. 1 may be a borosilicate nitride $SiB_xN_y$. A ratio of x to y represents a ratio of the number of boron atoms to that of nitrogen atoms in the borosilicate nitride, and $4 \geq y > x > 0$, $y-x \leq 2$. In some embodiments, the borosilicon nitride $SiB_xN_y$ is $SiB_2N_4$ or $SiB_{2.6}N_4$. It should be noted that, although the borosilicate nitride is represented by the formula of $SiB_xN_y$, it does not mean that the number of silicon atoms is 1. Compared with the ordinary materials, an etching rate of the borosilicon nitride is higher, that is, the borosilicon nitride can be etched more easily. Therefore, the cover layer 20 of the borosilicon nitride is adopted, which is prone to form the first communication hole 201 with a larger middle aperture, thereby increasing the surface area of the electrode plate and the capacitance.

In the embodiments of the disclosure, when silicon nitride is formed, boron can be introduced into a cavity to form the borosilicate nitride. At the same time, the ratio of the number of boron atoms to that of nitrogen atoms in the borosilicate nitride can be adjusted by controlling a flow ratio of nitrogen atoms to boron atoms. It should be noted that the borosilicate nitride can be etched more easily than silicon nitride, and a stress in silicon nitride can be reduced by doping boron atoms into silicon nitride. That is to say, a stress in the borosilicate nitride is small, and its internal interaction force is small, and a structural damage is not prone to occur. As a result, the performance of a device is improved. When a difference between the numbers of nitrogen atoms and boron atoms is less than or equal to 2, a content of nitrogen atoms in the borosilicate nitride can be increased, thus the etching rate of the borosilicate nitride can be increased, and the stress of the borosilicate nitride is small. If the difference between the numbers of nitrogen atoms and boron atoms is greater than 2, the content of boron atoms in the borosilicate nitride is low, the etching rate of the borosilicate nitride is low, and the stress of the borosilicate nitride is large.

Figure 5:
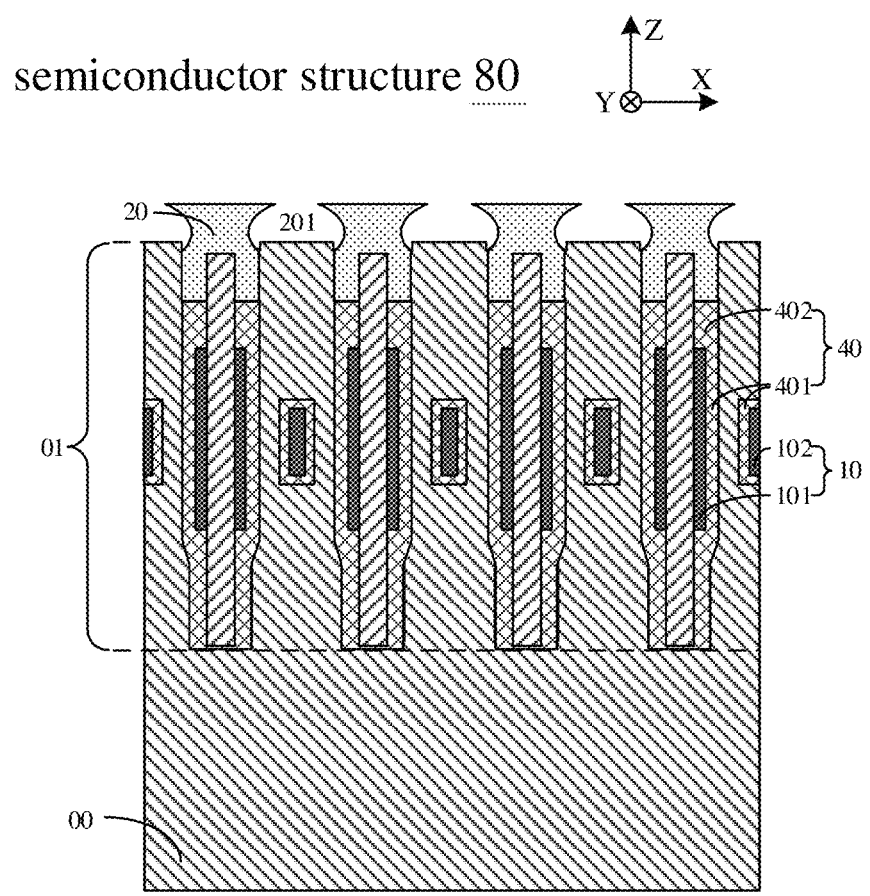
FIG. 5 is a fifth schematic diagram of a semiconductor structure provided by embodiments of the disclosure.

FIG. 5 is a cross-sectional view, which shows part of a structure located below the first sacrificial structure in the semiconductor structure. In some embodiments of the disclosure, referring to FIG. 5, the semiconductor structure 80 further includes a dielectric layer 40. The dielectric layer 40 includes a first portion 401 and a second portion 402. The first portion 401 of the dielectric layer 40 is located between the gate structure 10 and the semiconductor channel 01, and the second portion 402 of the dielectric layer 40 is located between the ring structure 101 and the cover layer 20. A thickness of the second portion 402 of the dielectric layer 40 is greater than a thickness of the first portion 401 of the dielectric layer 40, the thicknesses may refer to thicknesses along the first direction X.

In the embodiments of the disclosure, a material of dielectric layer 40 may be silicon oxide (SiO). The semiconductor channel 01, the gate structure 10 and the first portion 401 of the dielectric layer 40 together constitute a first transistor. The middle region of the semiconductor channel 01 forms a channel, and the gate structure 10 functions as a gate of the first transistor, and an upper side and a lower side of the middle region of the semiconductor channel 01 form a source and a drain, respectively. It should be noted that the middle region of the semiconductor channel 01 is a middle part of the semiconductor channel 01 along the vertical direction Z. The middle region of the semiconductor channel 01 is located between the top and the bottom of the semiconductor channel 01, and is away from the top and the bottom for a certain distance. The first portion 401 of the dielectric layer 40 functions as a gate dielectric of the first transistor, while the second portion 402 of the dielectric layer 40 protects the gate structure 10 from short circuit.

The first transistor is a VGAA transistor, that is, the channel formed by the semiconductor channel 01 extends along the vertical direction, and the ring structure 101 of the gate structure 10 encircles the channel. Therefore, under the same size, compared with a FinFET (fin field effect transistor) or other transistor structures, the gate of the first transistor can fully cover the channel, and thus a control ability of the gate is stronger.

Figure 6:
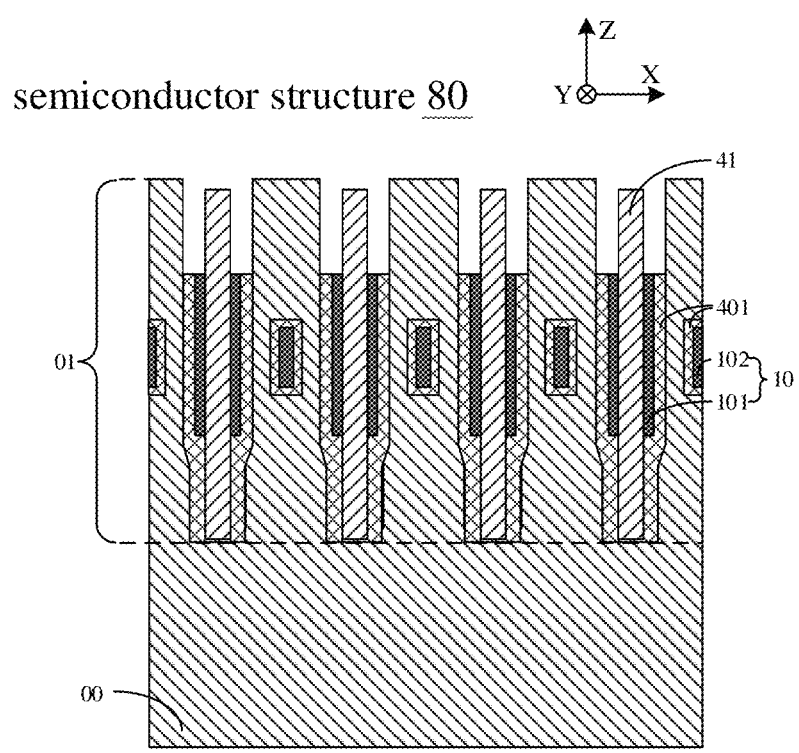
FIG. 6 is a sixth schematic diagram of a semiconductor structure provided by embodiments of the disclosure.
Figure 7:
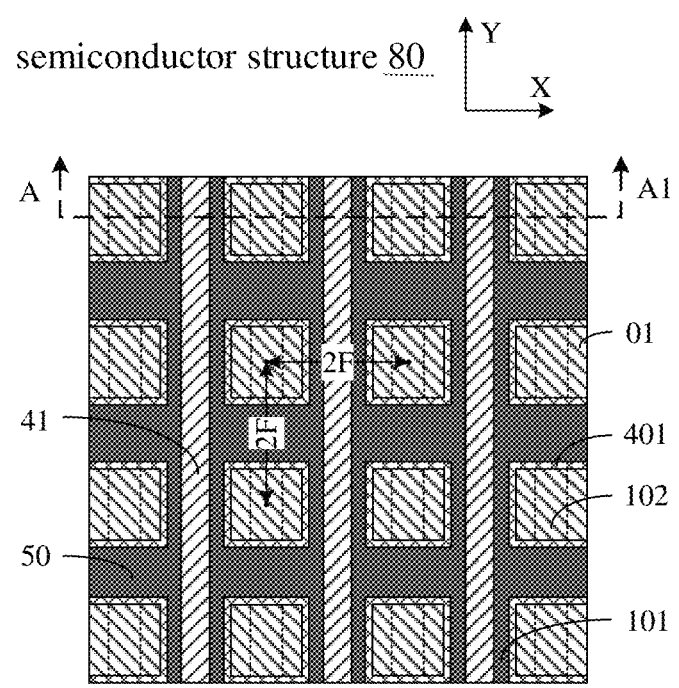
FIG. 7 is a seventh schematic diagram of a semiconductor structure provided by embodiments of the disclosure.

FIG. 6 and FIG. 7 show part of the structure below the cover layer in the semiconductor structure, and FIG. 7 is a top view, and FIG. 6 is a cross-sectional view taken along a cross-sectional line A-A1 of FIG. 7.

In the embodiments of the disclosure, referring to FIG. 7, a size of the semiconductor channel 01 meets $4F^2$ in a top view (F: the minimum pattern size obtainable under a given process condition). That is, a distance between center points of two adjacent semiconductor channel 01 in the first direction X is 2F, and a distance between center points of two adjacent semiconductor channel 01 in the second direction Y is also 2F. Therefore, an integration density of the semiconductor structure 80 is improved. In some embodiments, when memory cells are formed on the semiconductor channels 01, the memory cells may also be arranged in accordance with $4F^2$.

In the embodiments of the disclosure, referring to FIG. 6 and FIG. 7, the bridge structure 102 of the gate structure 10 penetrates through the semiconductor channel 01 and extends to the inner wall of the ring structure 101 along the penetrating direction (i.e. the second direction Y), and a through hole is formed by penetrating through the semiconductor channel 01, and the through hole is filled by the bridge structure 102, i.e., an inner wall of the through hole is covered by the bridge structure 102. In this way, the bridge structure 102 covers part of the channel, and a coverage area of the channel by the gate structure 10 is increased, and thus the channel is easier to be controlled, thereby improving the control ability of the gate of the formed first transistor and improving the overall electrical property of the semiconductor structure 80.

In some embodiments of the disclosure, referring to FIG. 6, a length of the ring structure 101 along the vertical direction Z is less than a length of the semiconductor channel 01 along the vertical direction Z, and a length of the bridge structure 102 along the vertical direction Z is less than or equal to the length of the ring structure 101 along the vertical direction Z.

It can be understood that the length of the ring structure 101 along the vertical direction Z is less than the length of the semiconductor channel 01 along the vertical direction Z, and a region of the semiconductor channel 01 not encircled by the ring structure 101 can form the source and drain of the transistor. Based on this, the length of the ring structure 101 along the vertical direction Z can be disposed long. In this way, the coverage area of the channel by the gate structure 10 is increased, thereby improving the control ability of the gate of the formed first transistor.

In some embodiments of the disclosure, referring to FIG. 6, a width of the middle region of the semiconductor channel 01 and a top width of the semiconductor channel 01 are less than a bottom width of the semiconductor channel 01. It should be noted that the middle region of the semiconductor channel 01 is the middle part of the semiconductor channel 01 along the vertical direction Z. The middle region of the semiconductor channel 01 is located between the top and the bottom of the semiconductor channel 01, and is away from the top and the bottom for a certain distance.

It can be understood that the width of the middle region of the semiconductor channel 01 is less than the bottom width of the semiconductor channel 01. Accordingly, the ring structure 101 of the gate structure 10 can be disposed thicker, which facilitates a reduction of a resistance of the ring structure 101 and a reduction of a gate voltage loss of the formed first transistor, thereby further improving the control ability of the gate of the first transistor.

In some embodiments of the disclosure, referring to FIG. 5, FIG. 6 and FIG. 7, the semiconductor structure 80 further includes a first isolation layer 41. The first isolation layer 41 is located in a spacer region between the adjacent semiconductor channels 01, and the first isolation layer 41 is covered by the cover layer 20. The ring structure 101 is located between the first isolation layer 41 and the semiconductor channel 01.

In the embodiments of the disclosure, the first isolation layer 41 extends along the second direction Y, isolating the adjacent semiconductor channels 01. In addition, gate structures 10 arranged in the second direction Y are connected in series by a word line 50 extending along the second direction Y, and the first isolation layer 41 is also used to isolate the adjacent word lines 50. A material of the first isolation layer 41 may be silicon nitride (SiN).

It can be understood that, since the gate structures 10 are connected in series by the word line 50, the word line 50 contacts the semiconductor channel 01 via the gate structure 10. Moreover, due to the arrangement of the ring structure 101 and the bridge structure 102, a contact area between the gate structure 10 and the semiconductor channel 01 is increased. As a result, a contact area between the word line 50 and the semiconductor channel 01 is increased, and a contact resistance between the word line 50 and the semiconductor channel 01 is reduced, an electrical stability of the word line 50 is improved, that is, a control ability of the word line 50 to the first transistor is improved.

Figure 8:
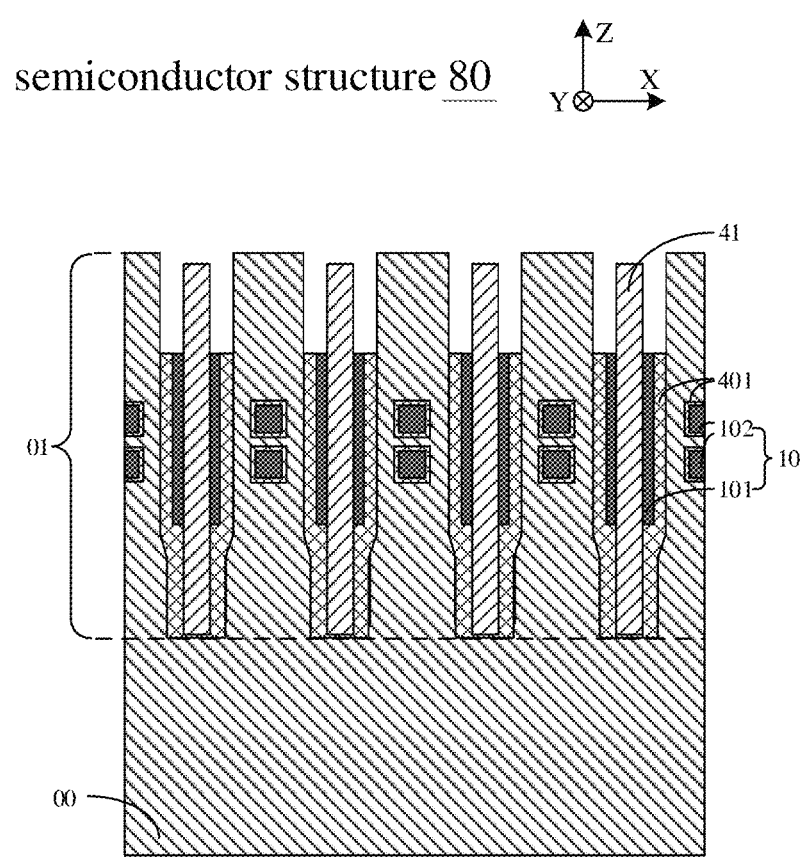
FIG. 8 is an eighth schematic diagram of a semiconductor structure provided by embodiments of the disclosure.

In some embodiments of the disclosure, as shown in FIG. 8, the number of bridge structures 102 is at least two, and the at least two bridge structures 102 are arranged along the vertical direction Z. It can be understood that, each bridge structure 102 covers an inner wall of one through hole of the semiconductor channel 01, that is, it covers part of the channel. The arrangement of the at least two bridge structures 102 can increase the coverage area of the channel, thereby improving the control ability of the gate of the formed first transistor.

In the embodiments of the disclosure, referring to FIG. 8, each bridge structure 102 has a width less than the width of the semiconductor channel 01. The semiconductor channel 01 is penetrated through by each bridge structure 102, and each bridge structure 102 covers the inner wall of each through hole. In this way, the contact area between the gate structure 10 and the semiconductor channel 01 is increased, i.e. a channel length corresponding to the gate structure 10 is increased, thereby improving the control ability of the gate structure 10 to the semiconductor channel 01 and reducing a contact resistance between the gate structure 10 and the semiconductor channel 01.

Figure 9:
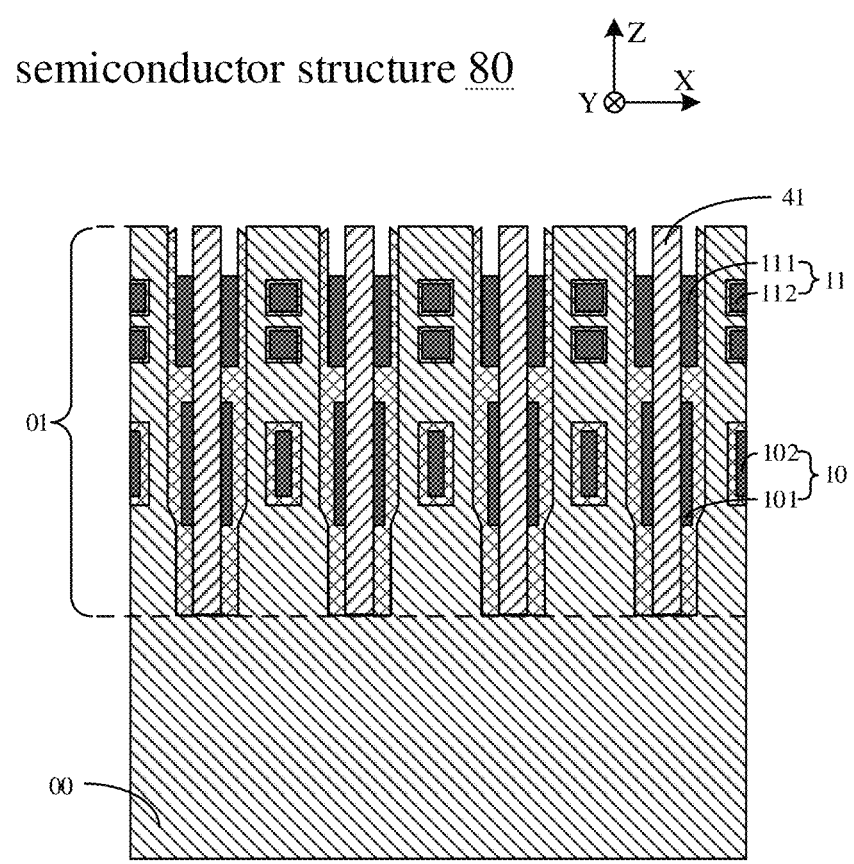
FIG. 9 is a ninth schematic diagram of a semiconductor structure provided by embodiments of the disclosure.

In some embodiments of the disclosure, as shown in FIG. 9, the semiconductor structure 80 further includes: a second gate structure 11. The second gate structure 11 is located above the gate structure 10. The second gate structure 11 may include a second ring structure 111 and a second bridge structure 112. The second ring structure 111 encircles the semiconductor channel 01 and the second bridge structure 112 penetrates through the semiconductor channel 01. It can be understood that, since the second gate structure 11 includes the second ring structure 111 encircling the semiconductor channel 01 and the second bridge structure 112 penetrating through the semiconductor channel 01, a coverage area of the semiconductor channel 01 by the second gate structure 11 is increased, thereby improving the control ability to the semiconductor structure 01 and improving the overall electrical property of the semiconductor structure 80.

In the embodiments of the disclosure, referring to FIG. 9, the semiconductor channel 01 and the gate structure 10 may form the first transistor, in which the gate structure 10 functions as the gate of the first transistor; while the semiconductor channel 01 and the second gate structure 11 may form a second transistor, in which the second gate structure 11 functions as a gate of the second transistor. The first transistor and the second transistor both can be used as access transistors. That is to say, both the gate of the first transistor and the gate of the second transistor can receive control signals, and control abilities of the gates of these two transistors to the semiconductor channel 01 can compensate with each other. For example, if the gate of one transistor fails to completely turn off the semiconductor channel 01, the gate of the other transistor can make up for it and turn off the semiconductor channel 01, thereby reducing the leakage current in the semiconductor channel 01 and improving the overall electrical property of the semiconductor structure 80.

Figure 10:
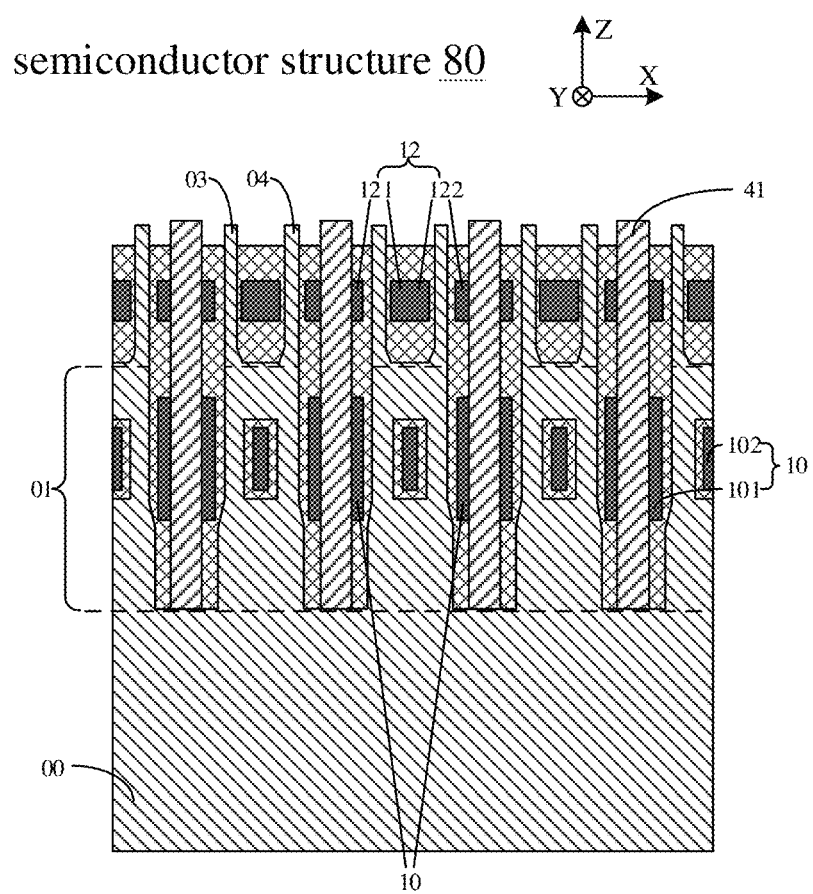
FIG. 10 is a tenth schematic diagram of a semiconductor structure provided by embodiments of the disclosure.

In some embodiments of the disclosure, as shown in FIG. 10, the semiconductor structure 80 further includes: a third gate structure 12. The substrate 00 further includes a second semiconductor channel 03 and a third semiconductor channel 04 extending along the vertical direction Z. The second semiconductor channel 03 and the third semiconductor channel 04 are provided on a top of each semiconductor channel 01. The third gate structure 12 is located above the gate structure 10 and disposed in middle regions of the second semiconductor channel 03 and the third semiconductor channel 04. The third gate structure 12 includes a third ring structure 121 and a fourth ring structure 122. The third ring structure 121 encircles the second semiconductor channel 03, and the second ring structure 122 encircles the third semiconductor channel 04.

In the embodiments of the disclosure, referring to FIG. 10, the semiconductor channel 01 and the gate structure 10 may form the first transistor, and the second semiconductor channel 03 and the third ring structure 121 may form a second transistor, and the third semiconductor channel 04 and the second ring structure 122 can form a third transistor. The gate of the first transistor, the gate of the second transistor and the gate of the third transistor all can receive control signals. The number of controlled structures increases, and control ability of the structures can compensate with each other, thereby improving the overall electrical property of the semiconductor structure 80.

Figure 11:
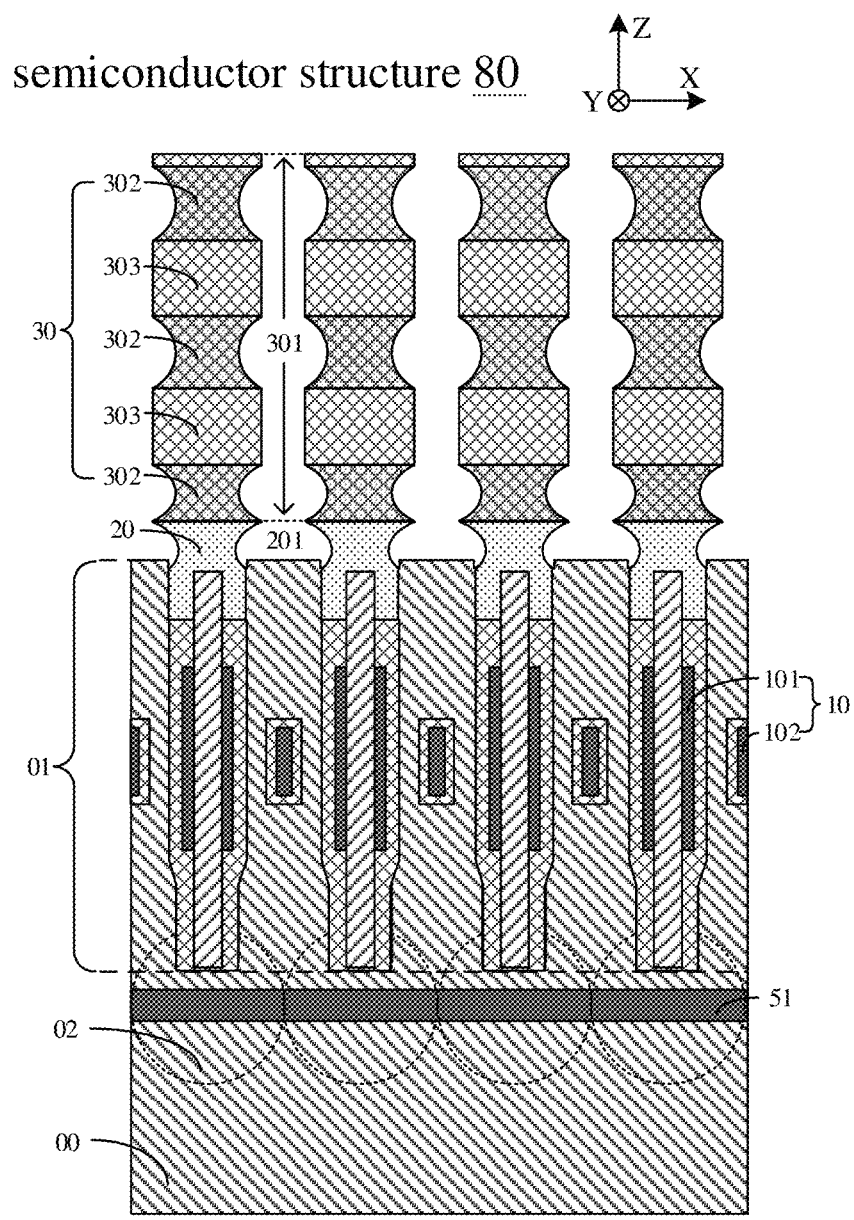
FIG. 11 is an eleventh schematic diagram of a semiconductor structure provided by embodiments of the disclosure.

In some embodiments of the disclosure, as shown in FIG. 11, the semiconductor structure 80 further includes: a bit line 51. The bit line 51 is located inside the substrate 00, and a bottom of the semiconductor channel 01 is electrically connected to the bit line 51.

In the embodiments of the disclosure, referring to FIG. 11, the bit line 51 extends along the first direction X. The substrate 00 may further include a metal silicide structure 02 (a region defined by a circular dashed line frame). Metal silicide structures 02 are connected with each other to form the bit line 51, and the bit line 51 is electrically connected to the bottoms of the semiconductor channels 01.

In the embodiments of the disclosure, a material of the metal silicide structure 02 includes at least one of cobalt silicide, nickel silicide, molybdenum silicide, titanium silicide, tungsten silicide, tantalum silicide or platinum silicide.

It can be understood that, compared with unmetallized semiconductor materials, the metal silicide structure 02 has a relatively smaller resistivity, which is beneficial to reduce a resistance of the bit line 51 and reduce a contact resistance between the bit line 51 and the semiconductor channel 01, thereby further improving the electrical property of the semiconductor structure 80.

In the embodiments of the disclosure, referring FIG. 7 and FIG. 11, the bottom of the semiconductor channel 01, as one of a source and a drain of the first transistor, can be electrically connected with the bit line 51; and the gate structures 10, as the gate of the first transistor, can be connected in series by the word line 50; the top of the semiconductor channel 01, as the other of the source and the drain of the first transistor, can be electrically connected with the capacitor structure to be formed subsequently. In this way, a memory cell circuit is formed, which can be used in a DRAM or other memories. Since the capacitance of the capacitor formed by the semiconductor structure 80 is larger, and the control ability of the gate of the formed first transistor is stronger, an electrical property of the formed memory cell circuit is improved, and thus an overall performance of the memory can be improved.

Embodiments of the disclosure further provide a method for manufacturing a semiconductor structure including S101 to S103, which will be described step by step.

It should be noted that FIG. 12 to FIG. 24 are partial schematic structural diagrams of a semiconductor structure in each operation, which are used to describe and clearly illustrate the operations of the method for manufacturing a semiconductor structure. Both a first direction X and a second direction Y, shown in FIG. 12 to FIG. 24, are perpendicular to a vertical direction Z. The first direction X and the second direction Y can be perpendicular to each other or at any included angle. Hereinbelow, an exemplary description is given with the first direction X being perpendicular to the second direction Y.

Figure 12:
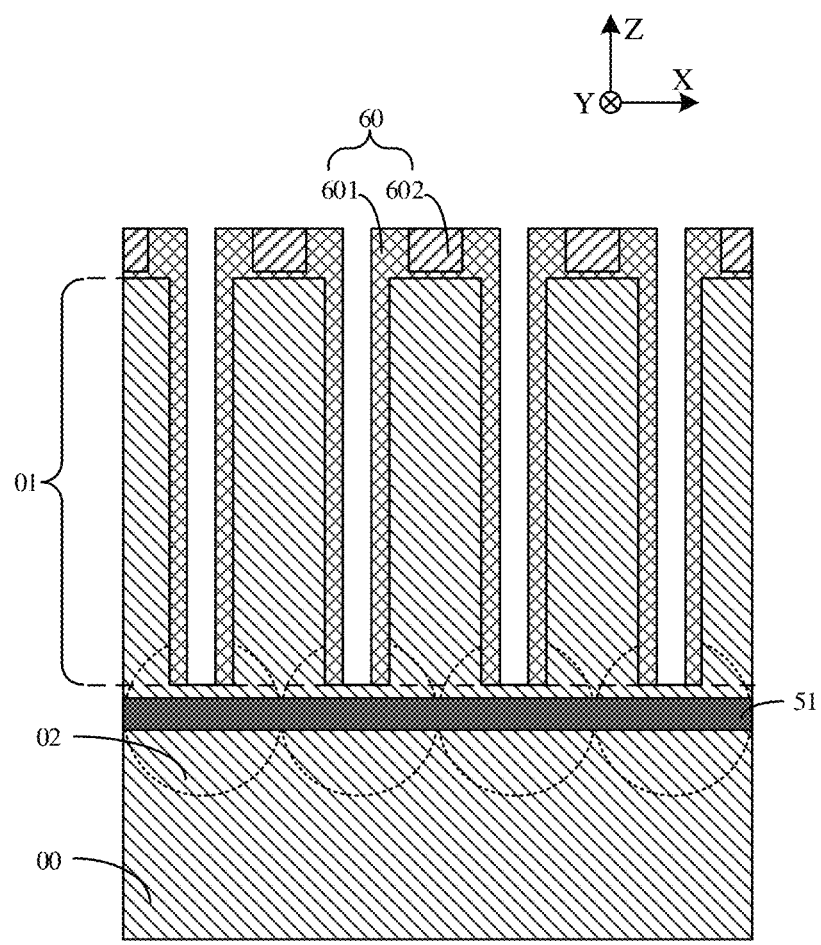
FIG. 12 is a first schematic diagram during a manufacturing method of a semiconductor structure provided by embodiments of the disclosure.

At S101, a substrate is provided. As shown in FIG. 12, the substrate 00 includes discrete semiconductor channels 01 arranged at a top of the substrate 00 and extending along the vertical direction Z.

In the embodiments of the disclosure, the substrate 00 may include at least one of semiconductor materials, for example, silicon (Si), germanium (Ge), silicon germanium (SiGe) or other Group IV elements; or gallium arsenide (GaAs), aluminum gallium arsenide (AlGaAs), indium arsenide (InAs), gallium indium arsenide (InGaAs) or other Group III-V compounds. Hereinbelow, an exemplary description is given with the substrate 00 including the silicon element.

A semiconductor channel 01 can have a doping element to improve a conductivity of the semiconductor channel 01. The doping element may be a P-type doping element or an N-type doping element. The N-type doping element may be at least one of arsenic (As), phosphorus (P) or antimony (Sb), and the P-type doping element may be at least one of boron (B), indium (In) or gallium (Ga).

In the embodiments of the disclosure, referring to FIG. 12, a bit line 51 is further provided in the substrate 00 and extends along the first direction X. The substrate 00 further includes a metal silicide structure 02 (a region defined by a circular dashed line frame). Metal silicide structures 02 are connected with each other to form the bit line 51. Bottoms of semiconductor channels 01 are electrically connected to the bit line 51. A material of the metal silicide structure 02 includes at least one of cobalt silicide, nickel silicide, molybdenum silicide, titanium silicide, tungsten silicide, tantalum silicide or platinum silicide.

Referring to FIG. 12, the semiconductor channel 01 is covered with a mask layer 60, a first portion 601 of the mask layer 60 covers sidewalls and a top of the semiconductor channel 01, and a second portion 602 of the mask layer 60 is filled in the middle of the first portion 601. Materials of the first portion 601 and the second portion 602 of the mask layer 60 are different. For example, the material of the first portion 601 is silicon oxide, while the material of the second portion 602 is silicon nitride. In this way, referring to FIG. 13 and FIG. 14, only the second portion 602 and part of the semiconductor channel 01 covered by it can be removed by etching with a certain selection ratio to form the groove 61 in the middle of the semiconductor channel 01. FIG. 15 is a top view of a single semiconductor channel 01. As shown in FIG. 15, the groove 61 extends along the second direction Y and penetrates through the semiconductor channel 01.

Figure 13:
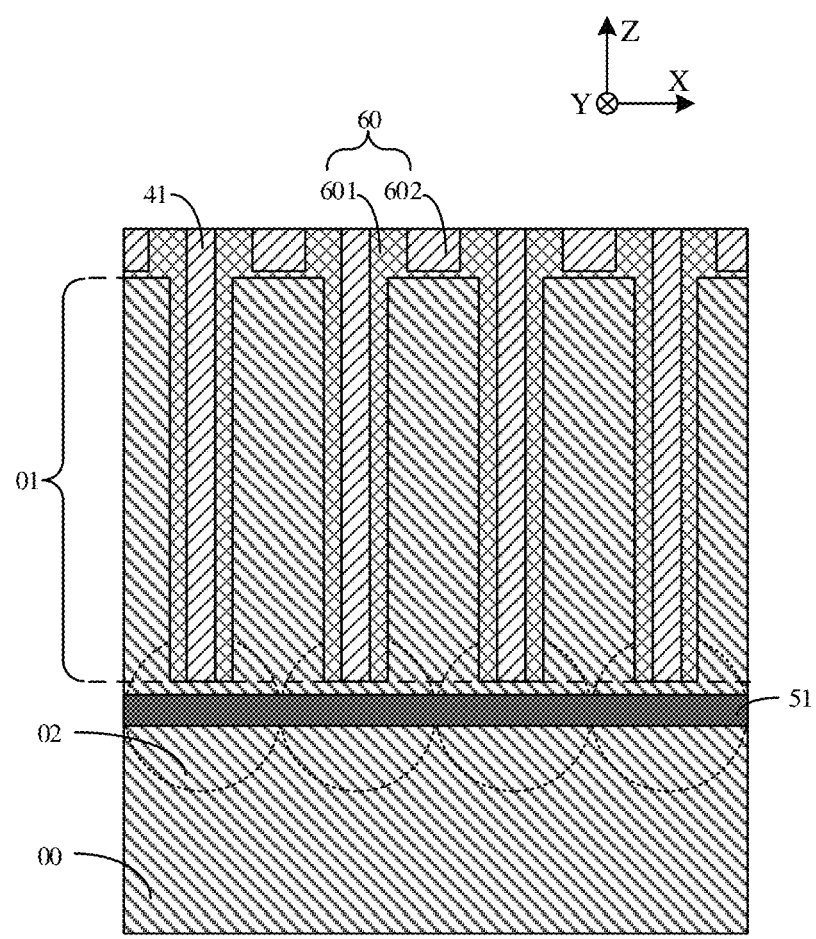
FIG. 13 is a second schematic diagram during a manufacturing method of a semiconductor structure provided by embodiments of the disclosure.

In the embodiments of the disclosure, referring to FIG. 13, a first isolation layer 41 may be formed by depositing before forming the groove by etching. The first isolation layer 41 extends along the second direction Y and isolates adjacent semiconductor channels 01. A material of the first isolation layer 41 may be silicon nitride.

Figure 14:
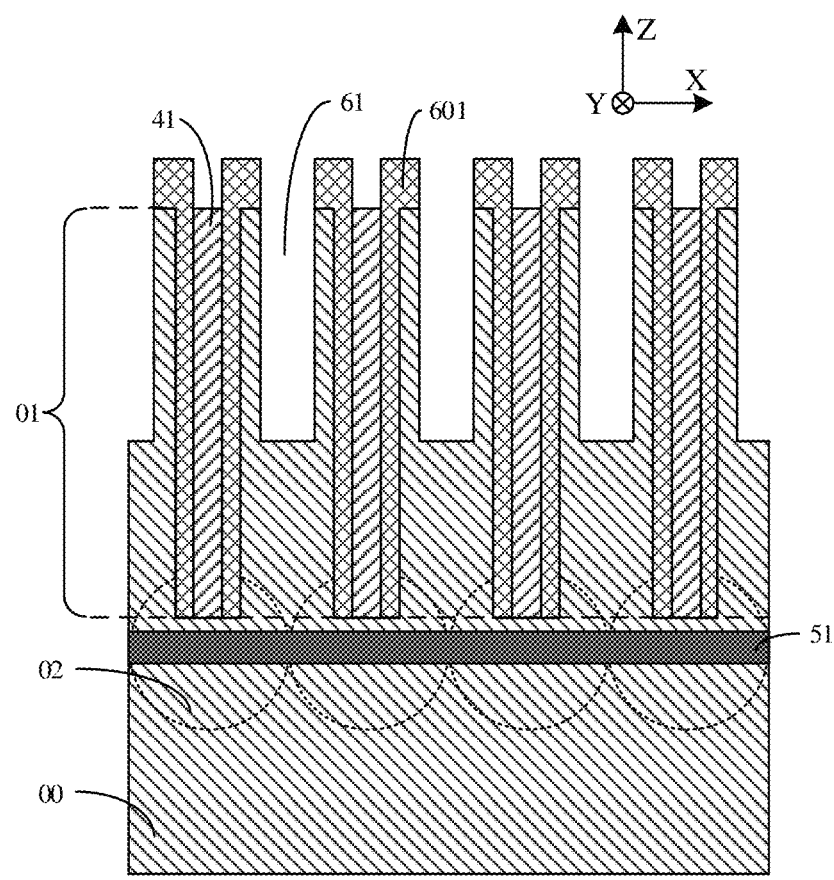
FIG. 14 is a third schematic diagram during a manufacturing method of a semiconductor structure provided by embodiments of the disclosure.
Figure 15:
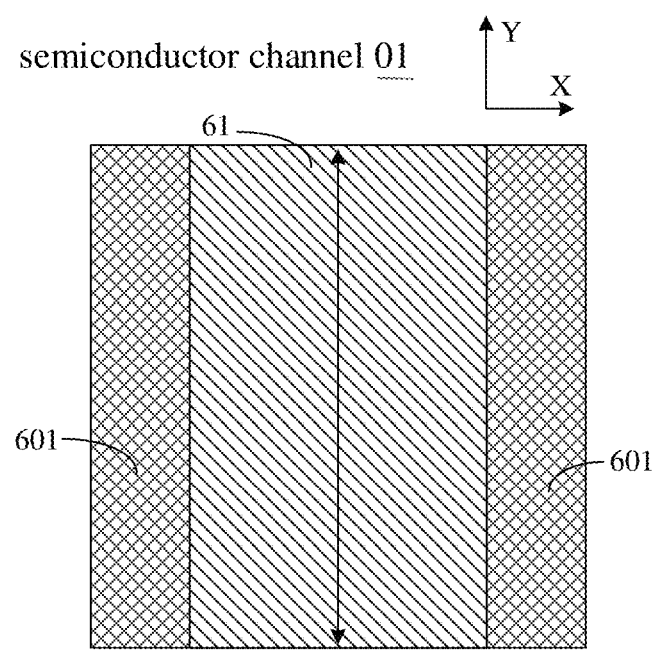
FIG. 15 is a fourth schematic diagram during a manufacturing method of a semiconductor structure provided by embodiments of the disclosure.
Figure 16:
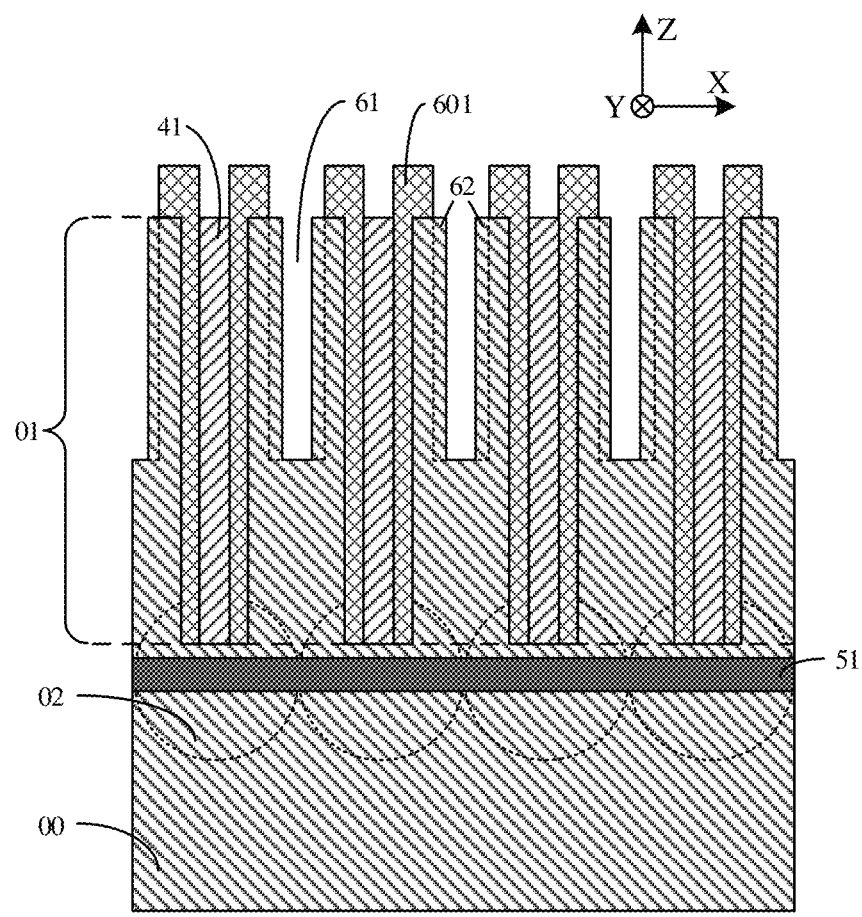
FIG. 16 is a fifth schematic diagram during a manufacturing method of a semiconductor structure provided by embodiments of the disclosure.

In the embodiments of the disclosure, referring to FIG. 14 and FIG. 16, after forming the groove 61 by etching, an epitaxial layer 62 may be formed on an inner wall of the groove 61 to reduce a width of the groove 61 and repair defects of the inner wall of the groove 61.

Figure 17:
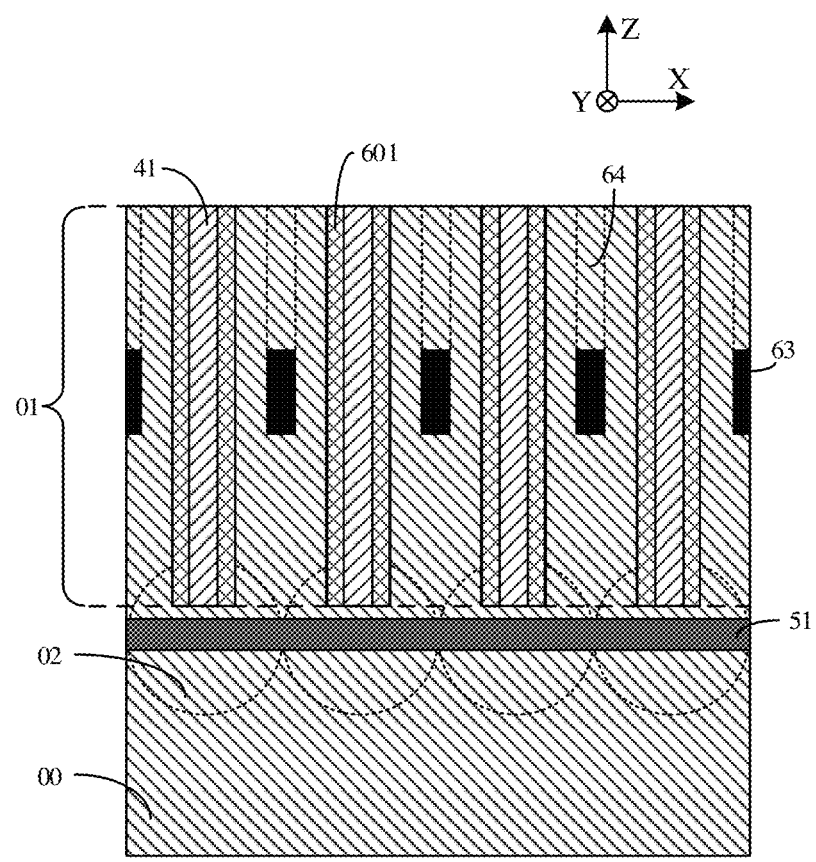
FIG. 17 is a sixth schematic diagram during a manufacturing method of a semiconductor structure provided by embodiments of the disclosure.

In the embodiments of the disclosure, referring to FIG. 16 and FIG. 17, a second sacrificial layer 63 may be formed in the groove 61 after forming the groove 61. A material of the second sacrificial layer 63 may be a silicon germanium (SiGe) material, which may be removed easily in the subsequent process, and provides a basis for forming a bridge structure of a gate structure in the subsequent process. Furthermore, referring to FIG. 17, a filling layer 64 may be formed in the groove 61. The filling layer 64 is located on the second sacrificial layer 63, and fills up a remaining space of the groove 61.

Figure 18:
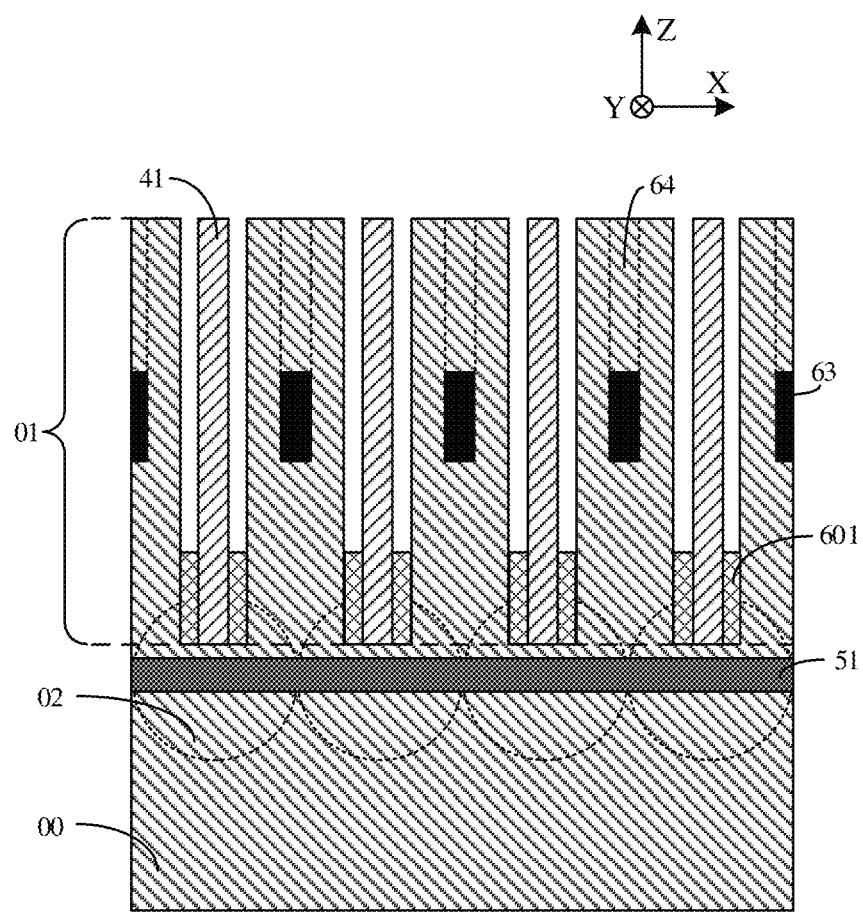
FIG. 18 is a seventh schematic diagram during a manufacturing method of a semiconductor structure provided by embodiments of the disclosure.

In the embodiments of the disclosure, referring to FIG. 13 and FIG. 18, for the first portion 601 of the mask layer 60, part of it covering the sidewalls of the semiconductor channel 01 can be etched to a bottom region of the semiconductor channel 01, as shown in FIG. 18. In this way, the sidewalls of the semiconductor channel 01 close to the bottom can be protected from short circuit.

At S102, a gate structure is formed in a middle region of the semiconductor channel.

Figure 19:
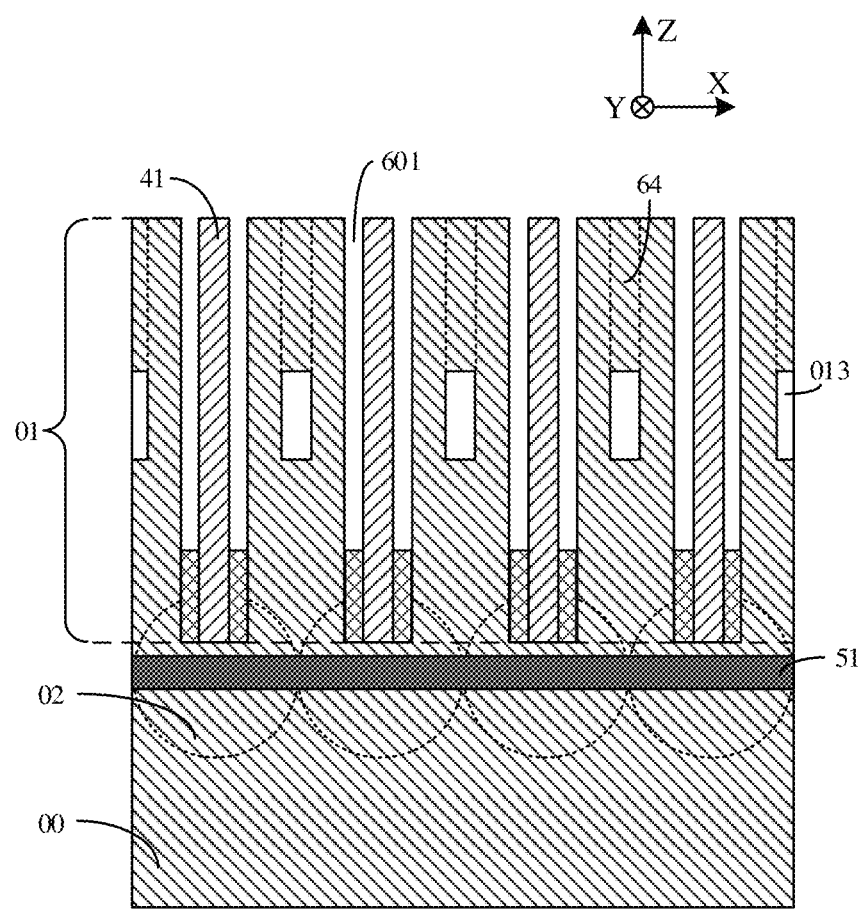
FIG. 19 is an eighth schematic diagram during a manufacturing method of a semiconductor structure provided by embodiments of the disclosure.

In the embodiments of the disclosure, referring to FIG. 18 and FIG. 19, a wet etch process may be adopted to remove the second sacrificial layer 63 filled in the semiconductor channel 01 to form a through hole 013 shown in FIG. 19.

Figure 20:
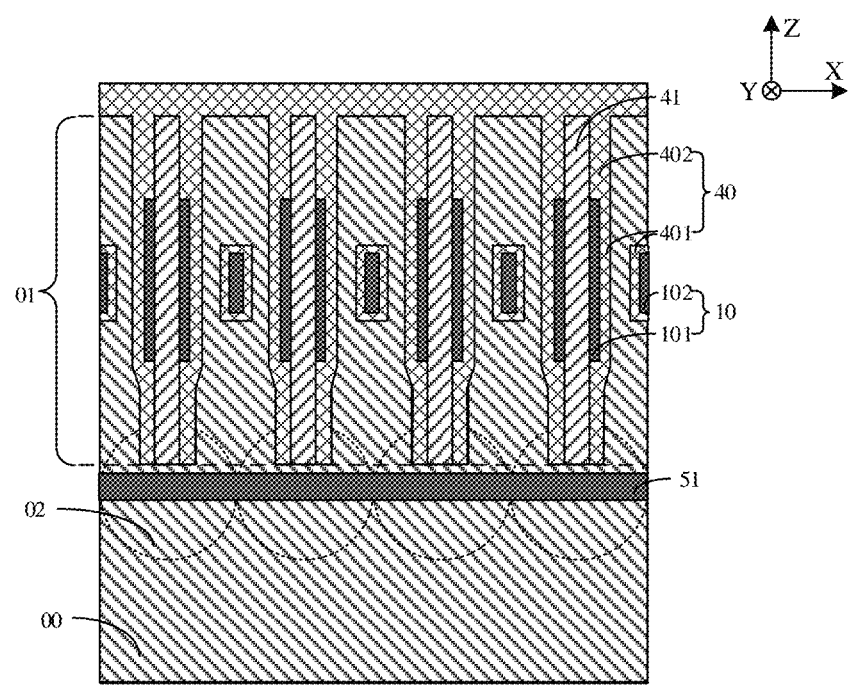
FIG. 20 is a ninth schematic diagram during a manufacturing method of a semiconductor structure provided by embodiments of the disclosure.

In the embodiments of the disclosure, referring to FIG. 19 and FIG. 20, after forming the through hole 013, an initial dielectric layer may be formed on sidewalls of the middle region of the semiconductor channel 01 and an inner wall of the through hole 013 by a chemical vapor deposition (CVD) process. The part of the initial dielectric layer on the middle region forms a first portion 401 of the dielectric layer 40, in which the first portion 401 of the dielectric layer 40 is located between the gate structure 10 and the semiconductor channel 01. A material of the initial dielectric layer may be silicon oxide.

In the embodiments of the disclosure, referring to FIG. 19 and FIG. 20, after forming the initial dielectric layer, a gate layer may be formed by encircling a sidewall of the initial dielectric layer and filling the through hole 013. The part of the gate layer filling the through hole 013 forms a bridge structure 102. A material of the gate layer may be titanium nitride or other conducting material. Then, the part of the gate layer encircling the sidewall of the initial dielectric layer may be etched back, and a remaining gate layer after etching back forms a ring structure 101. In this way, a gate structure 10 including the ring structure 101 and the bridge structure 102 is formed. Herein, the ring structure 101 encircles the semiconductor channel 01, and the bridge structure 102 penetrates through the semiconductor channel 01 and extends to an inner wall of the ring structure 101 along a penetrating direction. It can be understood that, the semiconductor channel 01 is penetrated through to form the through hole 013, and the through hole 013 is filled with the bridge structure 102, that is, the inner wall of the through hole 013 is covered by the bridge structure 102. In this way, a coverage area of the semiconductor channel 01 by the gate structure 10 is increased, thereby improving a control ability of a gate of a formed transistor.

In the embodiments of the disclosure, referring to FIG. 20, after forming the gate structure 10 including the ring structure 101 and the bridge structure 102, deposition of the initial dielectric layer may be continued to form a second portion 402 of the dielectric layer 40.

At S103, a cover layer and a first sacrificial structure are formed.

Figure 21:
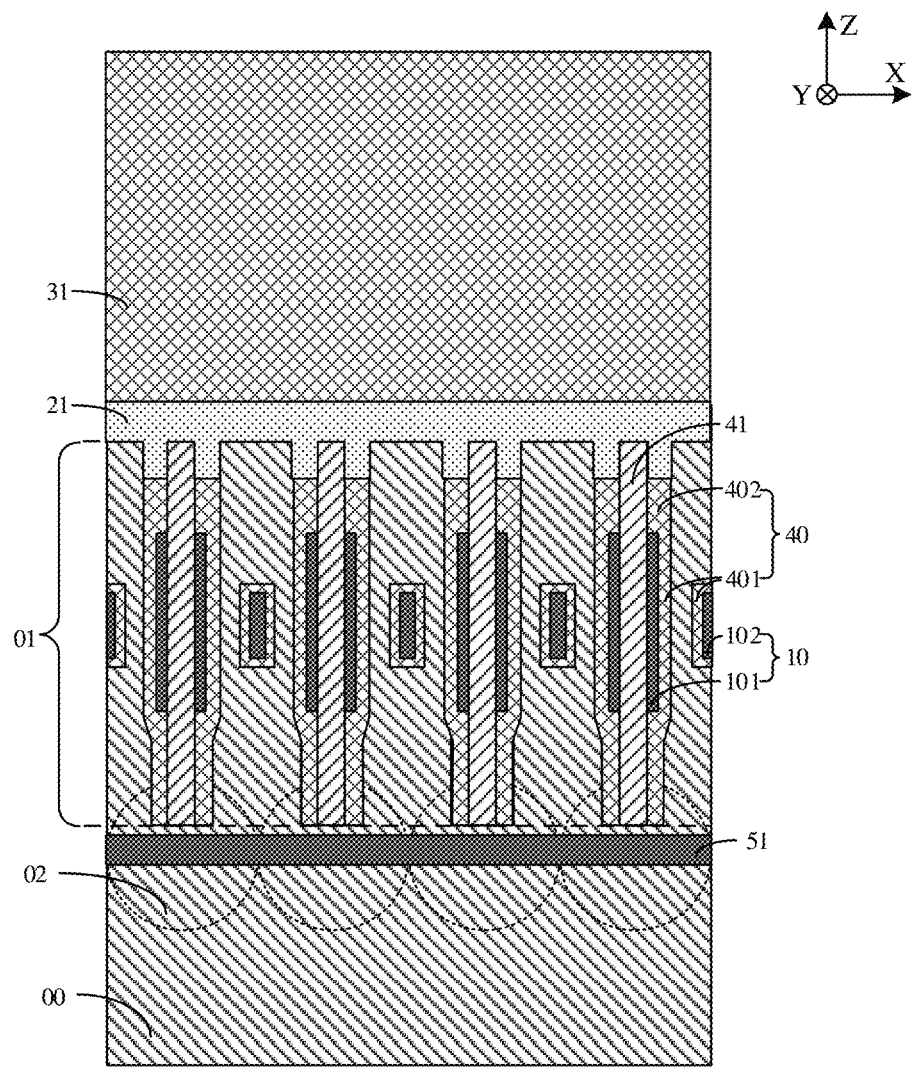
FIG. 21 is a tenth schematic diagram during a manufacturing method of a semiconductor structure provided by embodiments of the disclosure.

In the embodiments of the disclosure, referring to FIG. 20 and FIG. 21, firstly, the initial dielectric layer may be etched back, and a remaining initial dielectric layer functions as the second portion 402 of the dielectric layer 40. Then, referring to FIG. 21, an initial cover layer 21 may be deposited. The initial cover layer 21 covers the semiconductor channel 01, the first isolation layer 41 and the second portion 402 of the dielectric layer 40. A material of the initial cover layer 21 has a higher etching rate than ordinary materials.

In the embodiments of the disclosure, the material of the initial cover layer 21 may be a borosilicate nitride $SiB_xN_y$. A ratio of x to y represents a ratio of the number of boron atoms to that of nitrogen atoms in the borosilicate nitride, and $4 \geq y > x > 0$, $y-x \leq 2$. In some embodiments, the borosilicate nitride $SiB_xN_y$ may be $SiB_2N_4$ or $SiB_{2.6}N_4$. It should be noted that, although the borosilicate nitride is represented by the formula of $SiB_xN_y$, it does not mean that the number of silicon atoms is 1. Compared with the ordinary materials, an etching rate of borosilicate nitride is higher, that is, the borosilicate nitride can be etched more easily.

In the embodiments of the disclosure, when silicon nitride is formed, boron can be introduced into a cavity to form the borosilicate nitride, i.e., to form the initial cover layer 21. At the same time, the ratio of the number of boron atoms to that of nitrogen atoms in the borosilicate nitride can be adjusted by controlling a flow ratio of nitrogen atoms to boron atoms. It should be noted that, the borosilicate nitride can be etched more easily than silicon nitride, and a stress in silicon nitride can be reduced by doping boron atoms into silicon nitride. That is to say, a stress in the borosilicate nitride is small, and its internal interaction force is small, and a structural damage is not prone to occur. As a result, the performance of a device is improved. When a difference between the numbers of nitrogen atoms and boron atoms is less than or equal to 2, a content of nitrogen atoms in the borosilicate nitride can be increased, thus the etching rate of the borosilicate nitride can be increased, and the stress of the borosilicate nitride is small.

Figure 22:
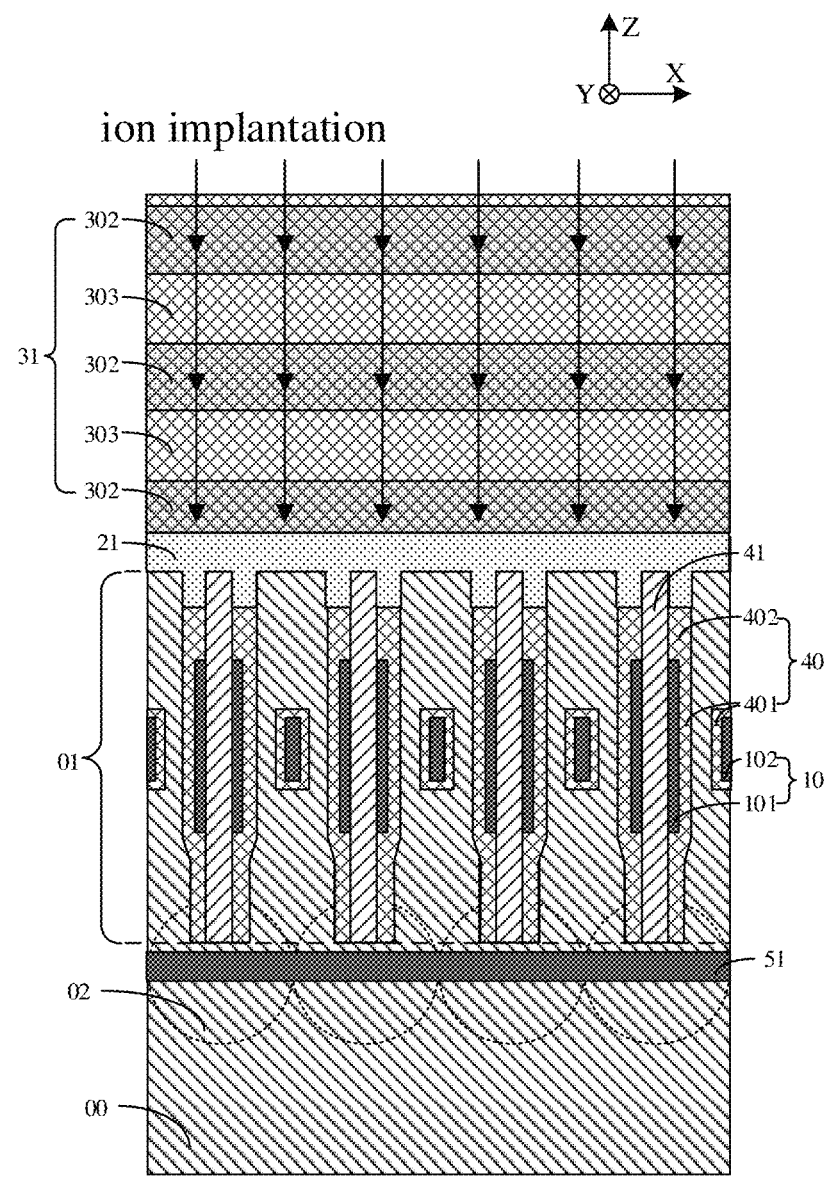
FIG. 22 is an eleventh schematic diagram during a manufacturing method of a semiconductor structure provided by embodiments of the disclosure.

In the embodiments of the disclosure, referring to FIG. 21, after forming the initial cover layer 21, a first sacrificial layer 31 may be deposited on the initial cover layer 21. Then, referring to FIG. 21 and FIG. 22, an ion implantation (IMP) process may be performed on the first sacrificial layer 31 to form additional doped regions 302 and intrinsic regions 303. A direction of the ion implantation is shown in FIG. 22. By controlling the ion implantation process with different energies, regions of different depths in the first sacrificial layer 31 can be doped, thereby forming the additional doped regions 302 and the intrinsic regions 303. The additional doped regions 302 and the intrinsic regions 303 are alternately arranged along the vertical direction Z. A doping concentration of an additional doped region 302 is greater than a doping concentration of an intrinsic region 303, and a thickness of the additional doped region 302 along the vertical direction Z is less than a thickness of the intrinsic region 303 along the vertical direction Z.

In the embodiments of the disclosure, referring to FIG. 21 and FIG. 22, a material of the first sacrificial layer 31 may be a boro-phospho-silicate glass (BPSG) doped with boron, and the boro-phospho-silicate glass doped with boron may be doped with boron again by an ion implantation process to form the additional doped regions 302 and the intrinsic regions 303. Of course, in some embodiments, the intrinsic regions 303 may be an undoped BPSG, i.e., the material of the first sacrificial layer 31 is the undoped BPSG.

Figure 23:
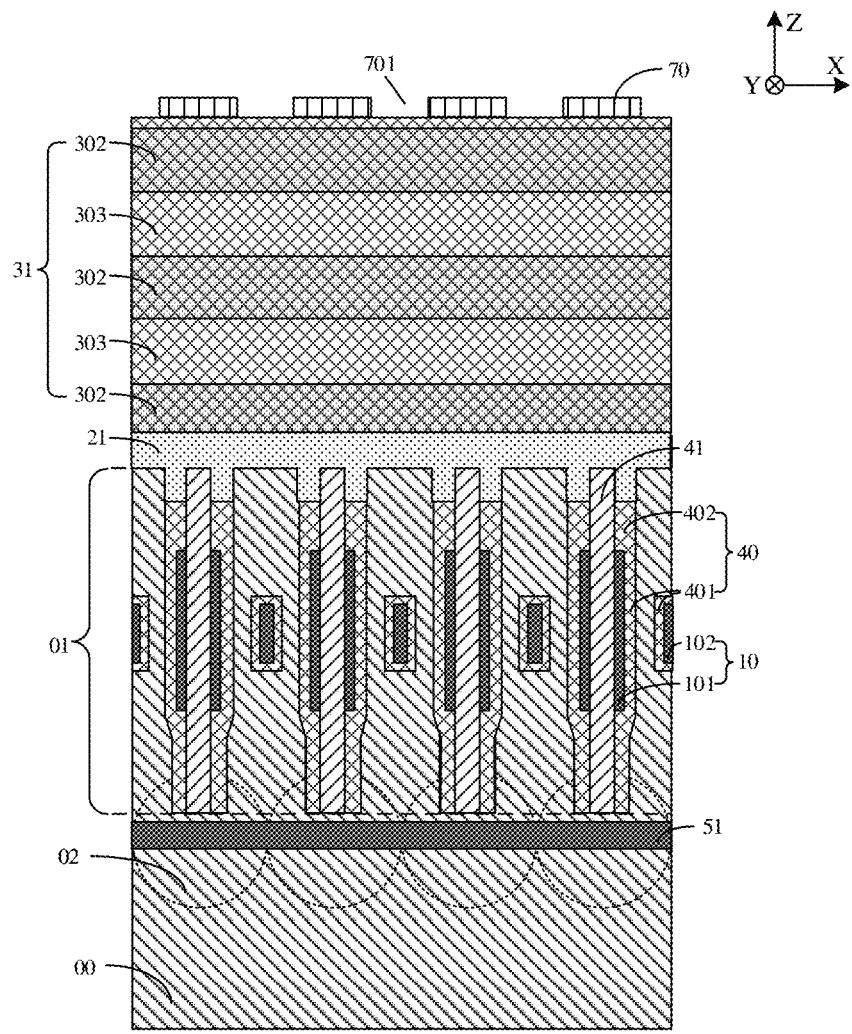
FIG. 23 is a twelfth schematic diagram during a manufacturing method of a semiconductor structure provided by embodiments of the disclosure.
Figure 24:
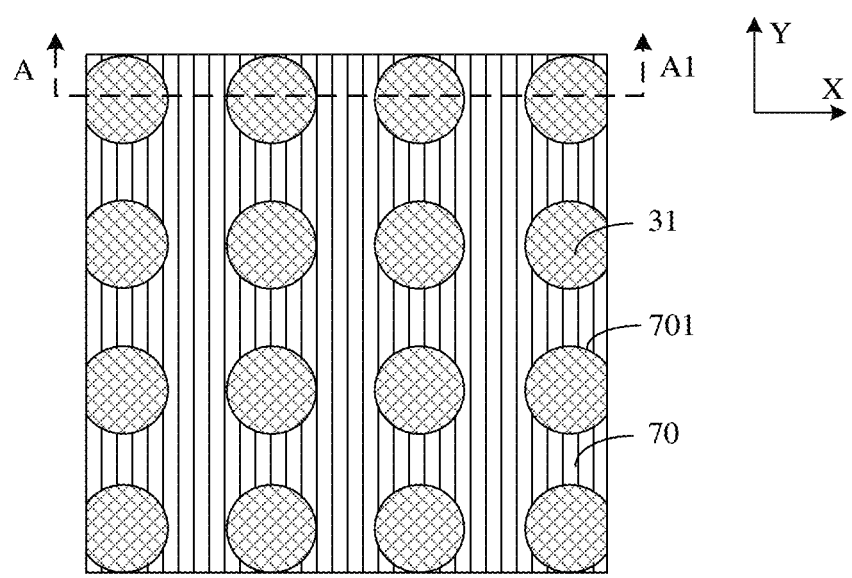
FIG. 24 is a thirteenth schematic diagram during a manufacturing method of a semiconductor structure provided by embodiments of the disclosure.

In the embodiments of the disclosure, referring to FIG. 22 and FIG. 23, after forming the additional doped regions 302 and the intrinsic regions 303 in the first sacrificial layer 31, a patterned first mask 70 may be formed on the first sacrificial layer 31. Herein, the first mask 70 includes third communication holes 701, which correspond to the semiconductor channels 01 one-to-one. Referring to FIG. 23 and FIG. 24, FIG. 24 is a top view, and FIG. 23 is a cross-sectional view taken along a cross-sectional line A-A1 of FIG. 24. The third communication holes 701 are distributed in the first mask 70, and a position of each third communication hole 701 corresponds to a position of a semiconductor channel 01, that is, each third communication hole 701 is located right above one semiconductor channel 01.

Then, referring to FIG. 23 and FIG. 24, etching can be performed based on a third communication hole 701 in the first mask 70 till a top of the semiconductor channel 01 to expose the top of the semiconductor channel 01, forming a second communication hole 301 in the first sacrificial layer 31 and forming a first communication hole 201 in the initial cover layer 21. As a result, the first sacrificial structure 30 and the cover layer 20 are formed, respectively.

Figure 25:
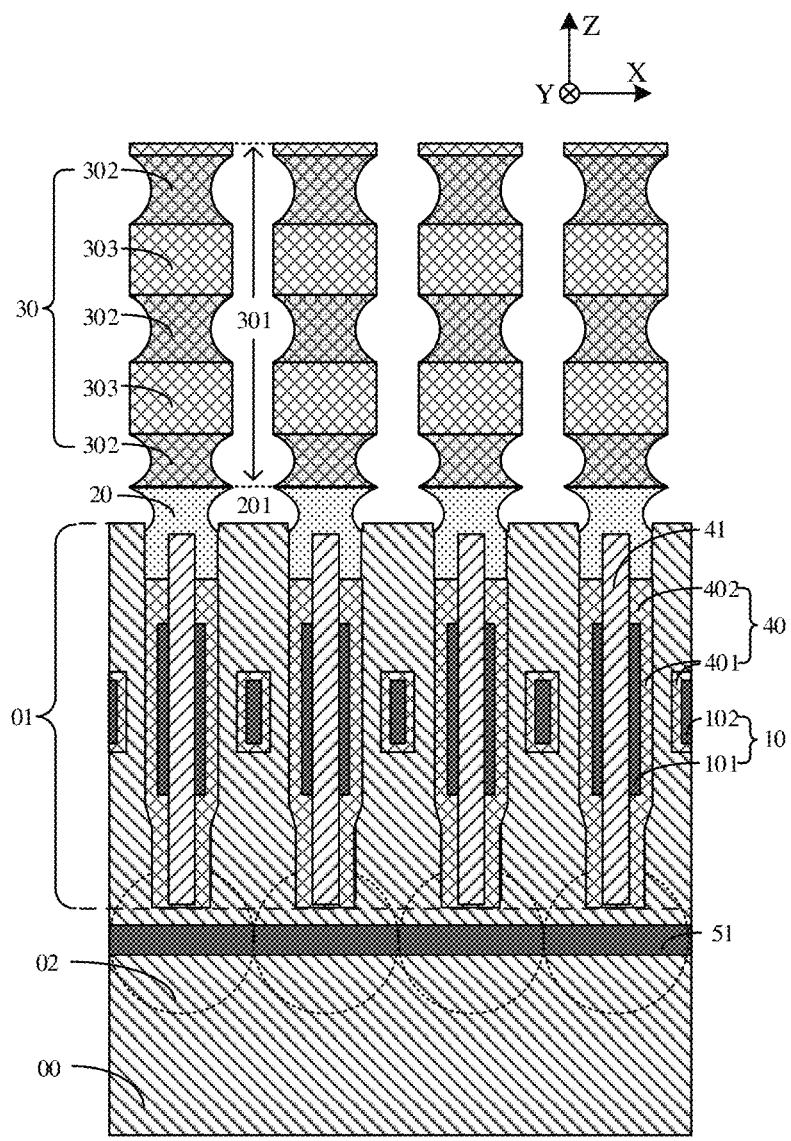
FIG. 25 is a fourteenth schematic diagram during a manufacturing method of a semiconductor structure provided by embodiments of the disclosure.

As shown by FIG. 25, the cover layer 20 is located in a spacer region between adjacent semiconductor channels 01, and includes the first communication hole 201 extending along the vertical direction Z. The first communication hole 201 exposes the top of the semiconductor channel 01 and part of its sidewall near the top. The first sacrificial structure 30 is located on the cover layer 20, and the first sacrificial structure 30 includes the second communication hole 301 extending along the vertical direction Z. The second communication hole 301 is in fluid communication with the top of the semiconductor channel 01 via the first communication hole 201. The first sacrificial structure 30 further includes the additional doped region 302 and the intrinsic region 303. The doping concentration of the additional doped region 302 is greater than the doping concentration of the intrinsic region 303. An aperture of the second communication hole 301 in the additional doped region 302 is greater than the aperture thereof in the intrinsic region 303.

It can be understood that, on the one hand, because the material of the initial cover layer 21 has a higher etching rate than the ordinary materials, when the initial cover layer 21 is etched, it is prone to form the first communication hole 201 with a large middle aperture, and the top of the semiconductor channel 01 and the part of its sidewall near the top are exposed, as shown in FIG. 25. Therefore, for a capacitor formed in the first communication hole 201, its electrode plate has a larger surface area and its capacitance is greater, and moreover, a contact area between the capacitor and the semiconductor channel 01 is greater, and a contact resistance is less.

On the other hand, since the additional doped region 302 can be etched more easily than the intrinsic region 303, so that an inner sidewall of the second communication hole 301 has the irregular shape. A capacitor may be formed in the second communication hole 301, and a capacitor plate covers the inner sidewall of the second communication hole 301. As a result, an area of the capacitor plate can be increased and a capacitance of the capacitor can be improved.

In some embodiments of the disclosure, referring to FIG. 13 to FIG. 20, forming the gate structure 10 includes S201 to S207, which will be described step by step.

At S201, a groove 61 is formed in the semiconductor channel 01.

In the embodiments of the disclosure, as shown in FIG. 13, the semiconductor channel 01 is covered with a mask layer 60, a first portion 601 of the mask layer 60 covers sidewalls and a top of the semiconductor channel 01, and a second portion 602 of the mask layer 60 is filled in the middle of the first portion 601.

Referring to FIG. 13 and FIG. 14, only the second portion 602 and part of the semiconductor channel 01 covered by the second portion 602 can be removed by etching with a certain selection ratio to form the groove 61 in the middle of the semiconductor channel 01. FIG. 15 is a top view of a single semiconductor channel 01. As shown in FIG. 15, the groove 61 extends along the second direction Y and penetrates through the semiconductor channel 01.

In the embodiments of the disclosure, referring to FIG. 14 and FIG. 16, after forming the groove 61 by etching, an epitaxial layer 62 may be formed on an inner wall of the groove 61 to reduce a width of the groove 61. The smaller a size of a mask pattern, the greater a process difficulty is. Herein, etching is firstly performed based on the second portion 602 of the mask layer, which is wider, and then the epitaxial layer 62 is formed to reduce the width of the groove 61. In this way, a groove with a smaller size is formed with a mask pattern with a larger size, reducing the process difficulty. Moreover, during forming the groove 61 by etching, defects and damages may be brought to the inner wall of the groove 61, and the epitaxial layer 62 can also repair the defects and damages of the inner wall of the groove 61, thereby reducing defects of the semiconductor channel 01 and improving a performance of the formed semiconductor structure.

At S202, a second sacrificial layer 63 is formed in the groove 61.

In the embodiments of the disclosure, referring to FIG. 16 and FIG. 17, after forming the groove 61, the second sacrificial layer 63 may be formed in the groove 61. A material of the second sacrificial layer 63 may be a silicon germanium (SiGe) material, so that it is prone to be removed in the subsequent process.

At S203, a filling layer 64 is formed in the groove 61. The filling layer 64 is located on the second sacrificial layer 63, and fills up a remaining space of the groove 61.

In the embodiments of the disclosure, if the gate structure to be formed includes only one bridge structure, the filling layer 64 formed on the second sacrificial layer 63 directly fills up the remaining space of the groove 61, as shown in FIG. 17. If the gate structure to be formed includes at least two bridge structures, after one filling layer 64 is formed on the second sacrificial layer 63, another second sacrificial layer 63 and another filling layer 64 are formed in the groove 61 in sequence, and finally the groove 61 is filled to its top with the filling layer 64. It can be understood that, forming the second sacrificial layer 63 and the filling layer 64 in the groove 61 in sequence provides a foundation for forming a bridge structure of a gate structure by the subsequent process.

At S204, the second sacrificial layer 63 is removed to form a through hole 013.

In the embodiments of the disclosure, referring to FIG. 18 and FIG. 19, a wet etch process may be adopted to remove the second sacrificial layer 63 filled in the semiconductor channel 01 to form the through hole 013 shown in FIG. 19. The through hole 013 penetrates through the semiconductor channel 01 along the second direction Y.

At S205, an initial dielectric layer is formed on sidewalls of a middle region of the semiconductor channel 01 and an inner wall of the through hole 013.

In the embodiments of the disclosure, referring to FIG. 19 and FIG. 20, after forming the through hole 013, a chemical vapor deposition (CVD) process may be adopted to form the initial dielectric layer on the sidewalls of the middle region of the semiconductor channel 01 and the inner wall of the through hole 013. The part of the initial dielectric layer on the middle region forms a first portion 401 of the dielectric layer 40, and the first portion 401 of the dielectric layer 40 is located between the gate structure 10 and the semiconductor channel 01. A material of the initial dielectric layer may be silicon oxide.

At S206, a gate layer may be formed by encircling a sidewall of the initial dielectric layer and filling the through hole 013. The part of the gate layer filling the through hole 013 forms a bridge structure 102.

In the embodiments of the disclosure, referring to FIG. 19 and FIG. 20, after forming the initial dielectric layer, the gate layer may be formed by encircling the sidewall of the initial dielectric layer and filling the through hole 013. The part of the gate layer filling the through hole 013 forms the bridge structure 102. A material of the gate layer may be titanium nitride or other conducting material.

At S207, the part of the gate layer encircling the sidewall of the initial dielectric layer is etched to form a ring structure 101.

In the embodiments of the disclosure, referring to FIG. 20, after the gate layer is formed, the part of the gate layer encircling the sidewall of the initial dielectric layer is etched back, and a remaining gate layer after etching back forms the ring structure 101. In this way, the gate structure 10 including the ring structure 101 and the bridge structure 102 is formed.

It can be understood that, the gate structure 10 includes the ring structure 101 and the bridge structure 102, and the coverage area of the semiconductor channel 01 by the gate structure 10 is increased, thereby improving a control ability of a gate of a formed transistor.

In the embodiments of the disclosure, referring FIG. 20 to FIG. 24, forming the cover layer 20 and the first sacrificial structure 30 includes S301 to S304, which will be described step by step.

At S301, an initial cover layer 21 is deposited.

In the embodiments of the disclosure, referring to FIG. 20 and FIG. 21, after forming the gate structure 10, the initial cover layer 21 may be deposited. The initial cover layer 21 covers the semiconductor channel 01, the first isolation layer 41 and the second portion 402 of the dielectric layer 40. A material of the initial cover layer 21 has a higher etching rate than ordinary materials.

In the embodiments of the disclosure, the material of the initial cover layer 21 may be a borosilicate nitride $SiB_xN_y$. A ratio of x to y represents a ratio of the number of boron atom to that of nitrogen atoms in the borosilicate nitride, and $4 \geq y > x > 0$, $y - x \geq 2$. In some embodiments, the borosilicate nitride $SiB_xN_y$ may be $SiB_2N_4$ or $SiB_{2.6}N_4$. It should be noted that, although the borosilicate nitride is represented by the formula of $SiB_xN_y$, it does not mean that the number of silicon atoms is 1. Compared with the ordinary materials, an etching rate of the borosilicate nitride is higher, that is, the borosilicate nitride can be etched more easily.

In the embodiments of the disclosure, when silicon nitride is formed, boron can be introduced into a cavity to form the borosilicate nitride, i.e., to form the initial cover layer 21. At the same time, the ratio of the number of boron atoms to that of nitrogen atoms in the borosilicate nitride can be adjusted by controlling a flow ratio of nitrogen atoms to boron atoms. It should be noted that, the borosilicate nitride can be etched more easily than silicon nitride, and a stress in the silicon nitride can be reduced by doping boron atoms into the silicon nitride. That is to say, a stress in the borosilicate nitride is small, and its internal interaction force is small, and a structural damage is not prone to occur. As a result, the performance of a device is improved. When a difference between the numbers of nitrogen atoms and boron atoms is less than or equal to 2, a content of nitrogen atoms in the borosilicate nitride can be increased, thus the etching rate of the borosilicate nitride can be increased, and the stress of the borosilicate nitride is small.

At S302, on the initial cover layer 21, a first sacrificial layer 31 is deposited.

In the embodiments of the disclosure, referring to FIG. 21, after forming the initial cover layer 21, the first sacrificial layer 31 may be deposited on the initial cover layer 21.

At S303, a patterned first mask 70 is formed on the first sacrificial layer 31.

In the embodiments of the disclosure, referring to FIG. 22 and FIG. 23, the patterned first mask 70 may be formed on the first sacrificial layer 31. The first mask 70 includes third communication holes 701, which correspond to the semiconductor channels 01 one-to-one. Referring to FIG. 23 and FIG. 24, FIG. 24 is a top view, and FIG. 23 is a cross-sectional view taken along a cross-sectional line A-A1 of FIG. 24. The third communication holes 701 are distributed in the first mask 70, and a position of each third communication hole 701 corresponds to a position of one semiconductor channel 01, that is, each third communication hole 701 is located right above one semiconductor channel 01.

At S304, etching can be performed based on a third communication hole 701 till a top of the semiconductor channel 01 to form a second communication hole 301 in the first sacrificial layer 31 and a first communication hole 201 in the initial cover layer 21. As a result, the first sacrificial structure 30 and the cover layer 20 are formed, respectively.

In the embodiments of the disclosure, referring to FIG. 23 and FIG. 24, etching can be performed based on the third communication hole 701 in the first mask 70 till the top of the semiconductor channel 01 to expose the top of the semiconductor channel 01, forming the second communication hole 301 in the first sacrificial layer 31 and forming the first communication hole 201 in the initial cover layer 21. As a result, the first sacrificial structure 30 and the cover layer 20 are formed, respectively. The first sacrificial layer 31 includes the additional doped region 302 and the intrinsic region 303. The doping concentration of the additional doped region 302 is greater than the doping concentration of the intrinsic region 303. That is, the additional doped region 302 can be etched more easily than the intrinsic region 303. As a result, an aperture of the second communication hole 301 in the additional doped region 302 is greater than the aperture thereof in the intrinsic region 303.

It can be understood that, on the one hand, because the material of the initial cover layer 21 has the higher etching rate than the ordinary materials, it is prone to form the first communication hole 201 with a large middle aperture. Therefore, for a capacitor formed in the first communication hole 201, its electrode plate has a larger surface area and its capacitance is greater, and moreover, a contact area between it and the semiconductor channel 01 is greater, and a contact resistance is less. On the other hand, since the additional doped region 302 can be etched more easily than the intrinsic region 303, so that an inner sidewall of the second communication hole 301 has the irregular shape. A capacitor may be formed in the second communication hole 301, and a capacitor plate covers the inner sidewall of the second communication hole 301, and therefore an area of the capacitor plate can be increased and a capacitance of the capacitor can be improved.

In some embodiments of the disclosure, referring to FIG. 21 and FIG. 22, prior to S304 described in the above, the method for manufacturing a semiconductor structure further includes S305, which will be described below.

At S305, an ion implantation process is performed on the first sacrificial layer to form additional doped regions and intrinsic regions in the first sacrificial layer.

In the embodiments of the disclosure, referring to FIG. 21 and FIG. 22, after forming the first sacrificial layer 31, the ion implantation (IMP) process may be performed on the first sacrificial layer 31 to form the additional doped regions 302 and the intrinsic regions 303 in the first sacrificial layer 31. A direction of the ion implantation is shown in FIG. 22. By controlling the ion implantation process with different energies, regions of different depths in the first sacrificial layer 31 can be doped, thereby forming the additional doped regions 302 and the intrinsic regions 303. The additional doped regions 302 and the intrinsic regions 303 are alternately arranged along the vertical direction Z. A doping concentration of an additional doped region 302 is greater than a doping concentration of an intrinsic region 303, and a thickness of the additional doped region 302 along the vertical direction Z is less than a thickness of the intrinsic region 303 along the vertical direction Z.

In the embodiments of the disclosure, referring to FIG. 21 and FIG. 22, a material of the first sacrificial layer 31 may be a boro-phospho-silicate glass (BPSG) doped with boron, and the boro-phospho-silicate glass (BPSG) doped with boron may be doped with boron again by an ion implantation process to form the additional doped regions 302 and the intrinsic regions 303. Of course, in some embodiments, the intrinsic regions 303 may be an undoped BPSG, i.e., the material of the first sacrificial layer 31 is the undoped BPSG.

It can be understood that, the regions of the different depths in the first sacrificial layer 31 can be doped by controlling the energy of the ion implantation process, thereby forming the additional doped regions 302 and the intrinsic regions 303 alternately arranged along the vertical direction Z. As a result, the second communication hole 301 with the inner sidewall having the irregular shape is formed.

It is to be noted that, in the present disclosure, terms "include" and "contain" or any other variant thereof are intended to refer to nonexclusive inclusions herein, so that a process, method, object or device including a series of elements not only includes those elements, but may further include other elements which are not clearly listed or may further include elements intrinsic to the process, the method, the object or the device. Unless otherwise specified, an element defined by the statement "including a/an . . . " does not exclude the presence of an additional same element in the process, method, object or device including the element.

The sequence numbers of the embodiments of the present disclosure are merely used for description and they do not represent superiority-inferiority of the embodiments. The methods disclosed in the several method embodiments provided in the present disclosure may be combined arbitrarily without conflict to obtain new method embodiments. The features disclosed in the several product embodiments provided in the present disclosure may be combined arbitrarily without conflict to obtain new product embodiments. The features disclosed in several method or device embodiments provided in the present disclosure may be combined arbitrarily without conflict to obtain new method embodiments or device embodiments.

The above is only the specific implementation mode of the present disclosure and not intended to limit the scope of protection of the present disclosure. Any variations or replacements easily obtained by those skilled in the art with reference to the technical scope disclosed by the present disclosure shall fall within the scope of protection of the present disclosure. Therefore, the scope of protection of the present disclosure shall be subject to the scope of protection of the claims.

Embodiments of the disclosure provide a semiconductor structure and a method for manufacturing the same. The semiconductor structure includes a substrate, a gate structure, a cover layer and a first sacrificial structure. The substrate includes discrete semiconductor channels arranged at a top of the substrate and extending along a vertical direction. The gate structure is disposed in a middle region of a semiconductor channel, and includes a ring structure and a bridge structure. The ring structure encircles the semiconductor channel, and the bridge structure penetrates through the semiconductor channel and extends to an inner wall of the ring structure along a penetrating direction. The cover layer is located in a spacer region between adjacent semiconductor channels, and includes a first communication hole extending along the vertical direction. The first sacrificial structure is located on the cover layer, and includes a second communication hole extending along the vertical direction. The second communication hole is in communication with the top of the semiconductor channel via the first communication hole. An inner sidewall of the second communication hole has an irregular shape. The inner sidewall of the second communication hole has the irregular shape, and a capacitor may be formed in the second communication hole and the capacitor plate covers the inner sidewall of the second communication hole. As a result, an area of the capacitor plate can be increased and a capacitance of the capacitor can be improved. Thus, the embodiments of the disclosure improve an overall electrical property of a semiconductor structure.

What is claimed is:

1. A semiconductor structure, comprising:
a substrate comprising discrete semiconductor channels arranged at a top of the substrate and extending along a vertical direction;
a gate structure being disposed in a middle region of each of the semiconductor channels and comprising a ring structure and a bridge structure, the ring structure encircling the semiconductor channel, the bridge structure penetrating through the semiconductor channel and extending to an inner wall of the ring structure along a penetrating direction;
a cover layer located in a spacer region between adjacent semiconductor channels, the cover layer comprising a first communication hole extending along the vertical direction; and
a first sacrificial structure located on the cover layer, the first sacrificial structure comprising a second communication hole extending along the vertical direction, the second communication hole being in communication with a top of the semiconductor channel via the first communication hole, an inner sidewall of the second communication hole having an irregular shape.

2. The semiconductor structure according to claim 1, wherein the first sacrificial structure further comprises an additional doped region and an intrinsic region, a doping concentration of the additional doped region being greater than a doping concentration of the intrinsic region; and
in the first sacrificial structure, an aperture of the second communication hole in the additional doped region being greater than the aperture thereof in the intrinsic region.

3. The semiconductor structure according to claim 2, wherein in the first sacrificial structure, the additional doped region and the intrinsic region are alternately arranged along the vertical direction.

4. The semiconductor structure according to claim 2, wherein a thickness of the additional doped region along the vertical direction is less than a thickness of the intrinsic region along the vertical direction.

5. The semiconductor structure according to claim 2, wherein a material of the first sacrificial structure is a boro-phospho-silicate glass, and a boron content of the additional doped region is greater than a boron content of the intrinsic region.

6. The semiconductor structure according to claim 1, wherein a top of the first communication hole is higher than the top of the semiconductor channel, and the top of the semiconductor channel and part of a sidewall near its top are exposed by the first communication hole; and
in the cover layer, a middle aperture of the first communication hole is greater than a top aperture or a bottom aperture thereof.

7. The semiconductor structure according to claim 1, wherein a length of the ring structure along the vertical direction is less than a length of the semiconductor channel along the vertical direction, and a length of the bridge structure along the vertical direction is less than or equal to the length of the ring structure along the vertical direction.

8. The semiconductor structure according to claim 1, further comprising: a dielectric layer comprising a first portion and a second portion,
the first portion of the dielectric layer being located between the gate structure and the semiconductor channel,
the second portion of the dielectric layer being located between the ring structure and the cover layer, and
a thickness of the second portion of the dielectric layer being greater than a thickness of the first portion of the dielectric layer.

9. The semiconductor structure according to claim 1, wherein both a width of a middle region of the semiconductor channel and a top width of the semiconductor channel are less than a bottom width of the semiconductor channel.

10. The semiconductor structure according to claim 1, further comprising:
a first isolation layer located in the spacer region and covered by the cover layer, the ring structure being located between the first isolation layer and the semiconductor channel.

11. The semiconductor structure according to claim 1, further comprising:
a bit line located in the substrate and electrically connected with a bottom of the semiconductor channel.

12. A method for manufacturing a semiconductor structure, comprising:
providing a substrate comprising discrete semiconductor channels, the semiconductor channels being disposed at a top of the substrate and extending along a vertical direction;
forming a gate structure in a middle region of each of the semiconductor channels, the gate structure comprising a ring structure and a bridge structure, wherein the ring structure encircles the semiconductor channel, and the bridge structure penetrates through the semiconductor channel and extends to an inner wall of the ring structure along a penetrating direction;

forming a cover layer in a spacer region between adjacent semiconductor channels, the cover layer comprising a first communication hole extending along the vertical direction; and forming a first sacrificial structure on the cover layer, the first sacrificial structure comprising a second communication hole extending along the vertical direction, the second communication hole being in communication with a top of the semiconductor channel via the first communication hole, an inner sidewall of the second communication hole having an irregular shape.

13. The method according to claim 12, wherein the forming the cover layer and the first sacrificial structure comprises:

depositing an initial cover layer;

depositing a first sacrificial layer on the initial cover layer;

forming a patterned first mask on the first sacrificial layer, the first mask comprising third communication holes, and the third communication holes corresponding to the semiconductor channels one-to-one; and etching with the third communication hole till the top of the semiconductor channel to form the second communication hole in the first sacrificial layer and form the first communication hole in the initial cover layer, such that the first sacrificial structure and the cover layer are formed, respectively; wherein the first sacrificial structure further comprises an additional doped region and an intrinsic region; and an aperture of the second communication hole in the additional doped region is greater than the aperture thereof in the intrinsic region.

14. The method according to claim 13, wherein the method further comprises: prior to etching with the third communication hole till the top of the semiconductor channel, performing ion implantation on the first sacrificial layer to form the additional doped region and the intrinsic region in the first sacrificial layer, a doping concentration of the additional doped region being greater than a doping concentration of the intrinsic region, the additional doped region and the intrinsic region being alternately arranged along the vertical direction, a thickness of the additional doped region along the vertical direction being less than a thickness of the intrinsic region along the vertical direction.

15. The method according to claim 12, wherein the forming the gate structure comprises:

forming a groove in the semiconductor channel;

forming a second sacrificial layer in the groove;

forming a filling layer in the groove, the filling layer being located on the second sacrificial layer and filling up a remaining space of the groove;

removing the second sacrificial layer to form a through hole, the through hole penetrating through the semiconductor channel;

forming an initial dielectric layer on a sidewall of the middle region of the semiconductor channel and on a sidewall of the through hole, part of the initial dielectric layer on the middle region forming a first portion of a dielectric layer, the first portion of the dielectric layer being located between the gate structure and the semiconductor channel;

forming a gate layer encircling a sidewall of the initial dielectric layer and filling the through hole, wherein part of the gate layer filling the through hole forms the bridge structure; and etching part of the gate layer encircling the sidewall of the initial dielectric layer to form the ring structure.

* * * * *